US006894266B2

(12) United States Patent
Richard et al.

(10) Patent No.: US 6,894,266 B2
(45) Date of Patent: May 17, 2005

(54) SINGLE CHIP ASIC AND COMPACT PACKAGING SOLUTION FOR AN AVALANCHE PHOTODIODE (APD) AND BIAS CIRCUIT

(75) Inventors: Jenkin Angelo Richard, Palo Alto, CA (US); Patrick B. Gilliland, Santa Barbara, CA (US); Eric Vaughan Chamness, Mountain View, CA (US); Evgueniy Dimitrov Anguelov, Sunnyvale, CA (US)

(73) Assignee: Oplink Communications, Inc., Fremont, CA (US)

( * ) Notice: Subject to any disclaimer, the term of this patent is extended or adjusted under 35 U.S.C. 154(b) by 274 days.

(21) Appl. No.: 10/367,126

(22) Filed: Feb. 14, 2003

(65) Prior Publication Data

US 2004/0159776 A1 Aug. 19, 2004

(51) Int. Cl.[7] .................................................. H01J 40/14
(52) U.S. Cl. .......................... 250/214 R; 250/214 LA; 250/239; 327/514
(58) Field of Search .......................... 250/239, 214 R, 250/214 A, 214 LA, 214 AG, 214 C, 214.1; 327/514, 530; 257/E31.116

(56) References Cited

U.S. PATENT DOCUMENTS

| 4,153,835 | A | | 5/1979 | Lau |
| 4,730,128 | A | | 3/1988 | Seki |
| 5,270,533 | A | | 12/1993 | Pulice |
| 6,157,022 | A | | 12/2000 | Maeda |
| 2004/0081473 | A1 | * | 4/2004 | Sherazi et al. ............... 398/212 |

OTHER PUBLICATIONS

Sumitomo Electric Data Sheet, F085249IT, APD Preamplifier Module, Apr. 24, 2002.
Mitsubishi Photo Diodes PD839C4 Data Sheet, InGaAs Avalanche Photo Diodes, Jul. 2002.
NEC Data Sheet, Receiver NR4500BP–CC, Aug. 2001.
Lucent Technologies, Low–Cost, High–Voltage APD Bias Circuit with Temperature Compensation, Application Note Jan. 1999.
Fairchild Semiconductor Data Sheet ILC6380/81, SOT–89 Step–up Dual–Mode Switcher with Shutdown, 2001.
MAXIM, 28V Internal Switch LCD Bias Supply in SOT23, Jul. 2000.
SFF Committee, Proposed Specification for GBIC (Gigabit Interface Converter) SFF Document #SFF–8054, Rev 5.4, Aug. 16, 1999.

* cited by examiner

*Primary Examiner*—Kevin Pyo
(74) *Attorney, Agent, or Firm*—Fish & Richardson P.C.

(57) ABSTRACT

A compact integrated APD device integrates the bias voltage and temperature compensation functions inside a standard 4-pin PIN package. The active components of the bias and temperature compensation circuits are integrated into a single ASIC using a high-voltage CMOS process and operated at frequencies of at least 1 MHz to greatly reduce the size of the passive components. To mount the relatively large ASIC chip inside the package with the APD chip, TIA chip and passives, the 4-pin package may be modified by either recessing the pins inside the can to facilitate surface mounting the ASIC or adding a spacer inside the can to facilitate three-dimensional packaging. Communication with the bias and temperature circuits is accomplished using a unique bi-directional 1-wire serial interface via the power supply pin. A clock signal is preferably embedded in the control data to synchronize the APD with an external controller.

43 Claims, 20 Drawing Sheets

SINGLE CHIP ASIC AND COMPACT PACKAGING SOLUTION FOR AN AVALANCHE PHOTODIODE (APD) AND BIAS CIRCUIT

BACKGROUND OF THE INVENTION

1. Field of the Invention

This invention relates to avalanche photodiodes (APD's) used in optical communication systems and more specifically to a single chip ASIC and compact packaging solution for an APD and its bias and temperature compensation circuits.

2. Description of the Related Art

PIN photodiodes and avalanche photodiodes (APDs) are both used as detectors in fiber optics communications systems. Standard PIN photodiodes combined with a TransImpedance Amplifier (TIA) to boost the low level signal from the PIN diode are available in compact packages and can be fully interfaced via 4 I/O pins; power supply, ground and a differential output. An industry standard package is the 4-pin TO-46 package or "can", which is compact, BellCor qualified and designed into many optical applications. The 4-pin TO-46 can has differential output pins DATA and DATA−, power supply pin Vs and ground pin GND. The term "pin" as used herein is intended to mean any electro-mechanical package I/O, which is commonly referred to as pins, pads or contacts.

A standard APD increases receiver sensitivity compared to an identical receiver using a PIN diode by 8 to 10 dB of optical power depending on details of the amplifier design, bit rate, etc. This enhancement of sensitivity, however, is achieved at the expense of having to provide a high voltage bias circuit that accurately controls a bias voltage (VAPD) of the APD, which is complicated by the fact that the APD gain and therefore the reverse bias requirement is temperature dependent.

The gain of a typical $n^+p\pi p^+$ APD at a given temperature increases rapidly with increasing reverse bias at low voltages corresponding to a sweepout of the device and then increases more gradually until avalanche breakdown is approached where the gain also increases very rapidly. If the temperature of the device is increased, the gain for a given bias voltage decreases because of the negative temperature dependence of the ionization coefficients for holes and electrons. To maintain appropriate gain and optimum reverse bias as a function of temperature, the bias circuit must vary the bias voltage of the device in a controlled manner. Failure to do so can cause the APD to be driven further into breakdown where it becomes exceedingly noisy, thereby drastically reducing the signal to noise ratio of the system.

As shown in FIG. 1, a typical APD and bias circuit solution includes an APD 10, a transimpedance amplifier (TIA) 12 and a pair of capacitors C1 and C3 inside a 5-pin package 14 such as a TO-46 package. 5-pin APD packages are available from Sumitomo (F0852491T APD Preamplifier Module), Mitsubishi, NEC, and others. The addition of the fifth pin increases the complexity of the package itself and the mechanical design of the board on which it is mounted.

The 5-pin TO-46 package has a power supply pin Vs, a ground pin GND, differential output pins DATA and DATA− and an APD voltage pin VAPD, which receives the bias voltage from an external high-voltage bias generator 18. A temperature sensor 20, which can be co-located inside the can with APD 10 or outside the can as long as the sensor remains in thermal contact with the APD, monitors the temperature of the APD. A temperature compensation circuit 22 determines what adjustments must be made to the bias voltage to maintain the appropriate gain and optimum bias voltage and controls bias generator 18 accordingly. An interface controller 24 sends APD temperature correction coefficients to the temperature compensation circuit 22. Interface controller 24 also sends requests for APD temperature and received power data to bias controller 18 and receives responses to these requests from bias generator 18 and temperature compensation circuit 22 via interfaces 26 and 28, either serially or in parallel. Typically these serial or parallel interfaces are 1–8 lines each and interface controller 24 communicates the same information with the rest of the network over an I²C serial connection 30. Interface controller 24 typically includes an EEPROM plus serial identification feature, which is mandated by industry multi-sourcing agreements covering GBIC and small form factor transceivers and allows the network to readout information about the transceiver and its status.

A number of companies including Lucent Technologies (Low-Cost, High-Voltage APD Bias Circuit with Temperature Compensation, Application Note January 1999), Fairchild Semiconductor (ILC 6380/81 SOT-89 Step-up Dual-Mode Switcher with Shutdown), and Maxim (28V Internal Switch LCD Bias Supply in SOT23) provide chip sets for the external bias generator 18 (temperature compensation circuit 22 is typically provided by the customer). As shown in FIG. 2 and as is typical of these chip sets, bias generator 18 includes an integrated circuit (IC) 32 that provides the Pulse Width Modulation (PWM) functions and external electronic components including inductor L1, FET Q1 and diode D1 that convert the low input supply voltage, typically in the range of 3.3–5VDC to a high APD bias voltage, typically in the range of 40–70VDC via the flyback effect. The high voltage is generated when the FET Q1, acting as a switch is cycled from "ON" to "OFF" by turning off its gate drive voltage. The current through inductor L1 changes instantaneously, causing a high transient voltage proportional to L(di/dt), which is rectified by diode D1 and stored by charge storage capacitor C2. As successive cycles of FET Q1 are completed, charge is built up on storage capacitor C2 and a limited amount of current may be supplied at a higher voltage, VAPD. The circuit uses a feedback connection from the VAPD output to control the duty cycle of the pulses via the PWM circuit, thus controlling and regulating the VAPD output. Although PWM voltage control is preferred, Pulse Frequency Modulation and other schemes involving feedback and proportional control may be used to control the output voltage of the APD bias supply.

IC 32 is fabricated using a low voltage process, e.g. less than 30V typically. Using the buck/boost converter topology, FET Q1 and diode D1 are both exposed to high voltages in excess of 30V and cannot be integrated onto the IC chip. Furthermore, the companies design the general-purpose bias generators to maximize power efficiency as they are used in a wide variety of applications including cell phones, pagers, and displays. To maximize power efficiency, PWM controllers are rarely switched at frequencies higher than 500 KHz and typically about 300 KHz. As a result, the passive components (inductors and capacitors) are large. The lack of integration into a single IC chip and the size of the passive components necessitate placement of the bias generator outside the APD package and provisioning of the bias voltage via the fifth pin. Instead of the buck/boost inductor coupled approach, other topologies for the DC-DC converter may be used such as a transformer coupled circuit.

As also shown in FIG. 2, a typical customer added temperature sensor and compensation circuit includes a thermistor $R_T$ in thermal contact with APD 10 and resistors R2, R3 and R4 that adjust the bias voltage with fluctuations in temperature. Again these passives are external to the APD package. The output voltage is set according to VAPD= VREF ×((R1+Reff)/Reff) where VAPD is the APD voltage, VREF is the internal reference voltage at the feedback comparator input (FB), and Reff is the effective resistance of the compensation circuit (R2+R3)+R4∥$R_T$.

The current state of the art is to use external bias and temperature compensation circuits in combination with a 5-pin APD package. The multi-chip approach simplifies design; each chip is optimized independently, simplifies packaging; each chip is packaged separate and simplifies control by providing multiple pins for control of the bias and temperature circuits via a standard serial interface. However, the external bias and temperature circuits occupy valuable space on the optical transceiver PC board, for example, and increase parts count, hence cost. The fifth pin also complicates the packaging of the device.

As fiber optic networks move towards CWDM application, longer transmission distances, increased network nodes, small form factor transceivers and standardization, a demand for compact and less expensive integrated APD packages is beginning to grow. The current multi-chip ASIC solution cannot scale down in either size or cost to meet this demand.

SUMMARY OF THE INVENTION

The present invention provides a compact integrated APD package that integrates the bias voltage and temperature compensation functions inside a standard 4-pin PIN diode package such as the TO-46 can with fewer parts. The APD package is substantially plug and play compatible with existing applications designed for PIN diodes with slight modifications for communication of control information to and from the integrated APD package to an external controller circuit.

This is accomplished by integrating the active components of the bias and temperature compensation circuits into a single ASIC using a high-voltage CMOS process and operating at frequencies of at least 1 MHz to reduce the size of the passive components. The combination of single-chip ASIC integration and smaller passives allows this circuitry to be packaged inside a standard 4-pin TO-46 package. To mount the relatively large ASIC chip inside the package with the APD chip, TIA chip and passives the 4-pin package may be modified by either recessing the pins inside the can to facilitate surface mounting the ASIC or adding a spacer or submount inside the can to facilitate three-dimensional packaging. Communication with the bias and temperature circuits is accomplished using a unique 1-wire serial interface circuit via the power supply pin. A clock signal is preferably embedded in the control data to synchronize the APD with an external controller. Communication is preferably bi-directional but serial-in may be applicable in some cases.

The same principles that facilitated integration of the bias and temperature circuits inside the standard 4-pin package can be applied to other small packages, which may or may not be industry standard packages, and which may have more than 4 pins, e.g. 8 or 16-pin butterfly packages. In such cases, a standard serial interface can be used to communicate with the circuits instead of the 1-wire serial interface circuit.

The same principles that provide sustained power to the chip while interrupting the power supply to send data bi-directionally via a 1-wire serial interface can be applied to other applications such as micro controller and microprocessor serial interfaces, sensors, transducers, and actuators peripheral to these compact systems.

These and other features and advantages of the invention will be apparent to those skilled in the art from the following detailed description of preferred embodiments, taken together with the accompanying drawings, in which:

DETAILED DESCRIPTION OF THE INVENTION

The present invention provides an APD package that integrates the bias voltage and temperature compensation functions inside a standard 4-pin Detector/TIA hybrid TO-46 package. The APD package is substantially plug and play compatible with existing applications designed for PIN/TIA hybrid packages with slight modifications for communications of control information to and from the integrated APD package to a controller circuit. All of the active components of the bias and temperature compensation circuits are integrated into a single ASIC using a high-voltage CMOS process, capable of operating up to at least 70V, which is operated at frequencies of at least 1 MHz to greatly reduce the size of the passive components. The combination of single-chip ASIC integration and much smaller passive components allows this circuitry to be packaged inside a standard 4-pin package. Small internal modifications to the package in the form of recessed pins or a spacer/submount may be needed to facilitate packaging the additional ASIC and passive components without modification to the header. Communication with the bias and temperature circuits is accomplished using a unique bi-directional 1-wire serial interface operating over the power supply pin. A clock signal is preferably embedded in the control data to synchronize the APD with an external controller.

Integrated 4-pin APD Package

Figure 3:
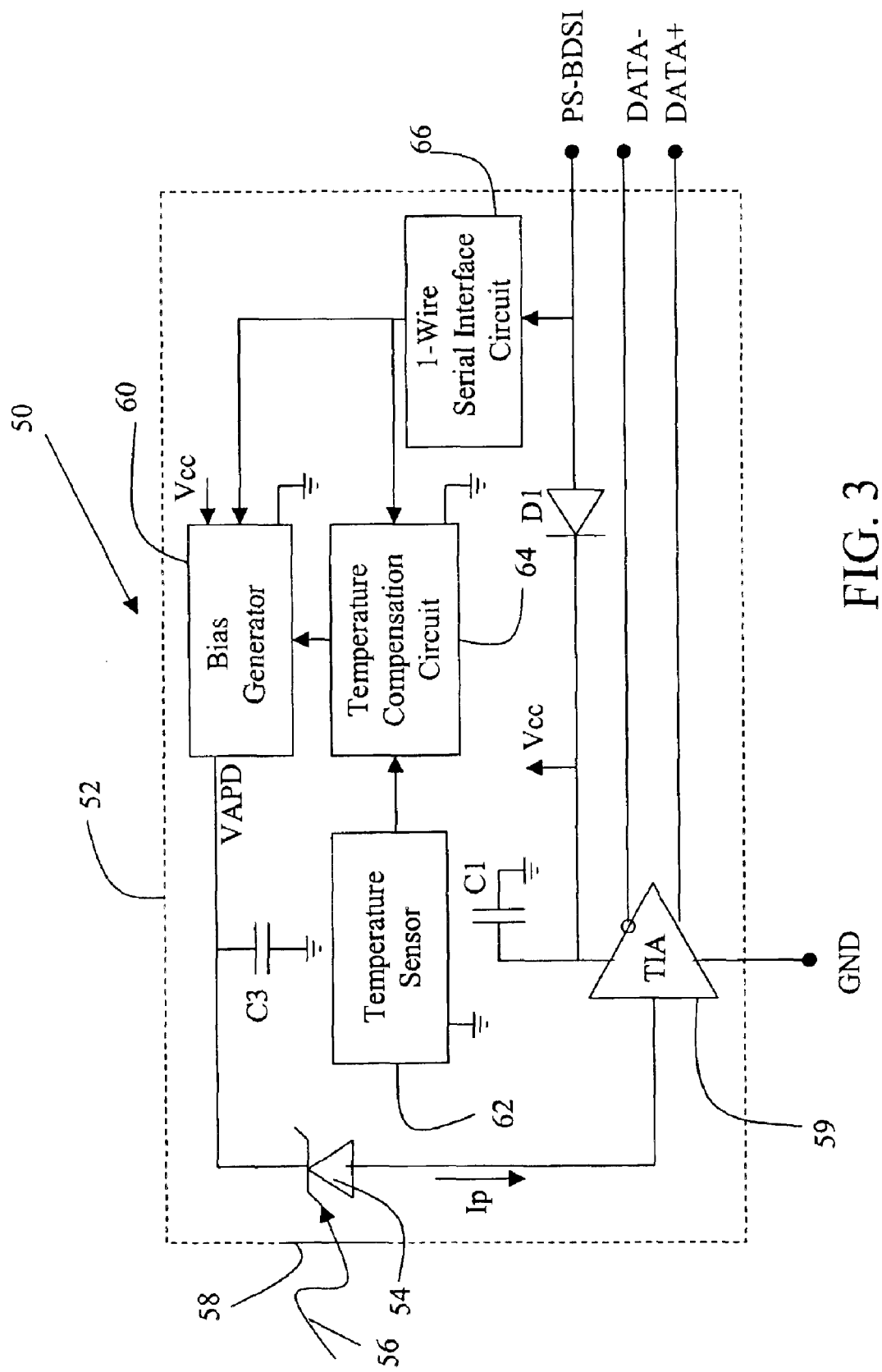
FIG. 3 is a functional block diagram of an integrated 4-pin APD package in accordance with the present invention.

As shown in FIG. 3, an integrated 4-pin APD package 50 of the current invention includes a 4-pin package 52 having a Power Supply & Bi-Directional Serial Interface (PS-BDSI) pin, a GND pin, a DATA+ pin and a DATA− pin. An APD 54 is configured to generate a photocurrent $I_p$ in response to light 56 sensed through a transparent window 58 in package 52. A transimpedance amplifier (TIA) 59 amplifies photocurrent $I_p$ and produces a differential voltage signal that is output on the DATA+ and DATA− pins. Photocurrent $I_p$ has both a DC component and a high-speed digital component corresponding to data rates in the 100 Mbit/s–3.2 Gbit/s data rates. Capacitors C3 and C1 at the cathode of the APD and the supply side of the TIA, respectively, act as storage and filtering elements to remove noise and transient voltage effects. Capacitor C1 also functions as a storage capacitor in bias generator 60 (as shown in FIG. 4b).

A bias generator 60 steps-up the supply voltage provided at the PS-BDSI pin to produce a bias voltage VAPD to reverse bias APD 54. A temperature sensor 62, suitably a band gap reference, senses the temperature of APD 54. A temperature compensation circuit 64 determines what adjustments must be made to the bias voltage as function of temperature to maintain optimum bias conditions in APD 54 and controls bias generator 60 accordingly. Communication with bias generator 60 and temperature compensation circuit 64 is achieved between an external interface controller (not shown) and 1-wire serial interface circuit 66 using a 1-wire serial interface protocol operating over the PS-BDSI pin, which provides a semi-continuous supply voltage to the chip while modulating the power supply to send and receive data either bi-directionally or in a serial-in fashion only. A Manchester encoder/decoder embeds a clock signal in transmitted control data and recovers the clock signal from received control data.

4-pin APD Package with Bi-directional Communication

Figure 4A:
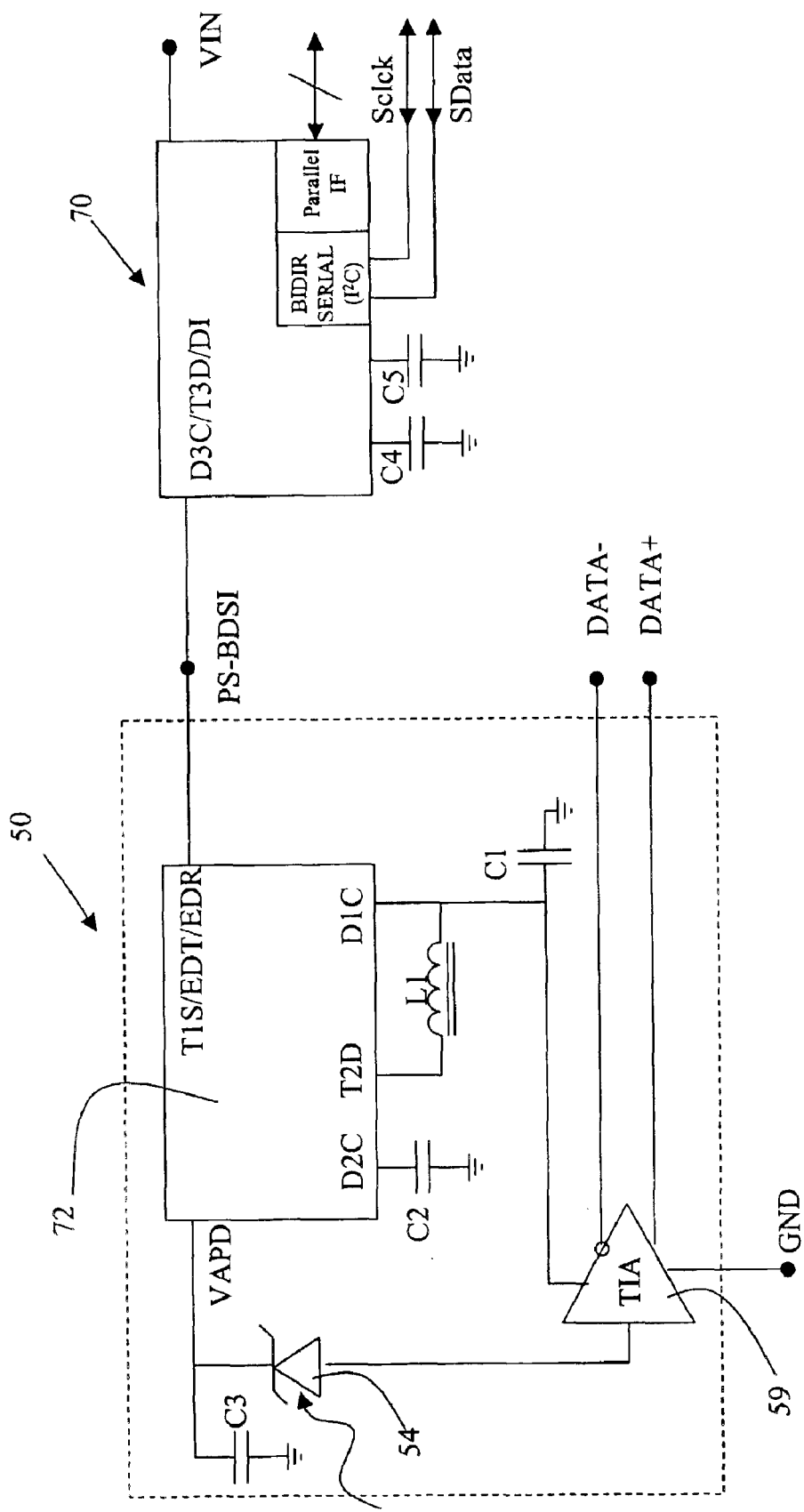
FIGS. 4a through 4c are a block diagram of an integrated APD package and external bi-directional communication interface controller circuit, a detailed functional block diagram of the APD package, and a detailed functional block diagram of the external interface controller, respectively.
Figure 4B:
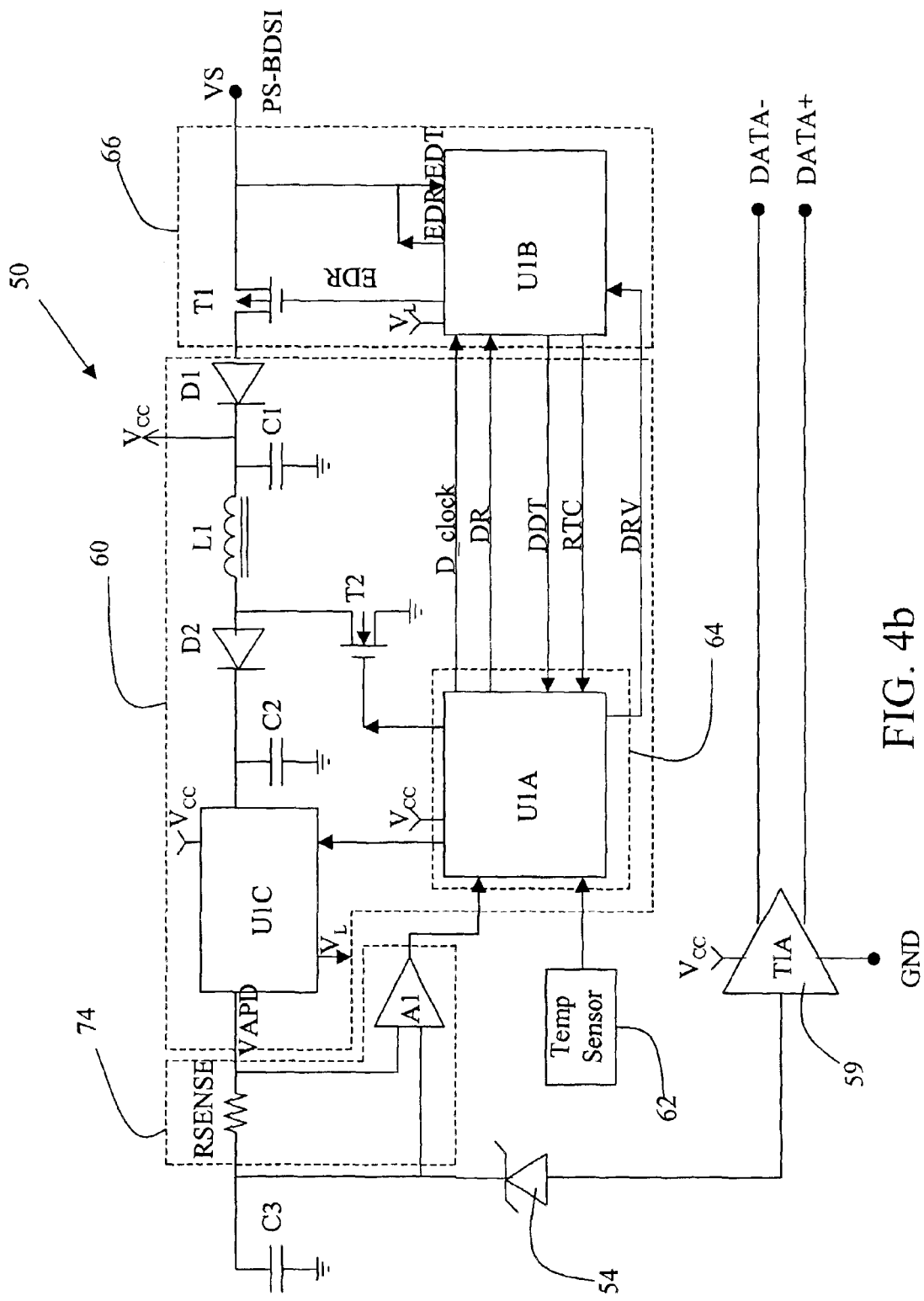
Figure 4C:
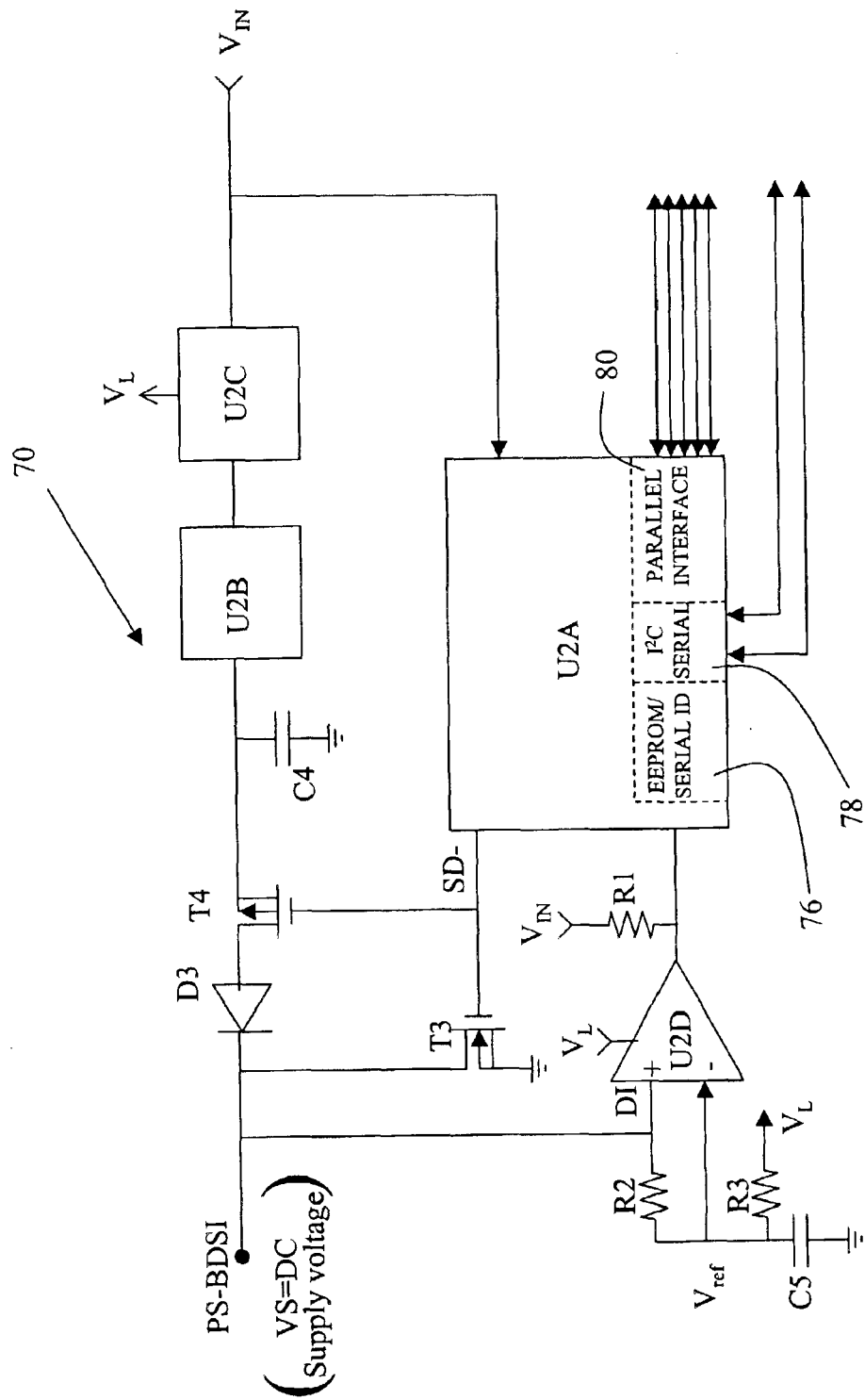

As shown in FIGS. 4a through 4c, integrated 4-pin APD package 50 is provided with an external interface controller 70 and configured for bi-directional communication through the 1-wire serial interface via the PS-BDSI pin. As shown in FIG. 4a, the APD package 50 is a three-chip solution, APD 54, TIA 59 and bias control ASIC 72 plus passive components L1, C1, C2, C3. At a minimum all of the active components for the bias generator 60 (PWM Controller U1A, Dual Output Regulator U1C, Diodes D1 and D2 and FET T2 shown in FIG. 4b) and 1-wire serial interface circuit 66 (FET T1 and Signal logic U1B shown in FIG. 4b) are preferably integrated on ASIC 72. In this particular embodiment, the temperature sensor 62 and temperature compensation circuit 64 (also U1A) and the components of a power sense circuit 74 (Amp A1 and resistor RSENSE) for sensing the optical power detected by the APD are also integrated into ASIC 72. In some applications, the optical power monitoring capability may be omitted and the temperature compensation circuitry be provided by the user by downloading temperature compensation. coefficients to temperature compensation circuit 64 via the PS-BDSI pin during an initial calibration period. This would allow for independent operation of the bias control ASIC 72. The passive components, capacitors C1, C2 and C3 and inductor L1 are also inside the TO-46 PIN/TIA hybrid package.

As is also shown in FIG. 4a, the external interface controller may be implemented in a single ASIC 70 plus capacitors C4, C5. As shown in FIG. 4c, this ASIC includes a timing and control generator U2A, a voltage doubler U2C, regulator U2B, FETS T3 and T4, diode D3 and a comparator U2D with pull-up resistor R1 and a reference voltage circuit with R2, R3, and C5. The timing and control generator U2A suitably includes an EEPROM to facilitate Serial ID capability 76 and an I2C serial interface 78 or a parallel interface 80, or both. By incorporating this functionality, ASIC 70 can be a drop-in replacement for the Serial ID EEPROM specified by GBIC and SFP MSA (Multi-Sourcing Agreement) control documents and provide the communications necessary for the bi-directional 1-wire serial interface without additional parts count much as the 4-pin APD/TIA hybrid package is a drop-in replacement for conventional 4-pin PIN/TIA hybrid packages.

The incorporation of the bias and temperature circuits inside the 4-pin package necessitates that one pin must be used to both supply power to the package and enable data transfer to-and-from the package. This is achieved with a unique 1-wire bi-directional serial interface. The interface operates in a normal mode, under which power is supplied to the PS-BDSI pin, and data transfer and return verification modes, in which control information such as APD voltage temperature compensation coefficients, sensed power data, and sensed temperature data is sent back-and-forth. The high speed digital data generated by the APD/TIA from the optical input signal 56 and transmitted via the DATA+ and DATA− pins is separate and is operated normally regardless of any control and sensor data transfer activity on the PS-BDSI line.

Normal Mode

In the normal mode, external interface controller 70 supplies a DC voltage VS to the PS-BDSI pin, typically about 4.0–5.7 V DC. More specifically and as illustrated in FIG. 4c, an input voltage VIN, nominally 3.3 or 5V DC, is applied to voltage doubler U2C, which generates a high voltage logic supply VL, typically 6.6 or 10 V DC. Regulator U2B establishes a regulated voltage, typically 4.7 or 6.4 V DC (depending on the value of VIN) across energy storage capacitor C4, typically 10–100UF. Timing and control generator U2A drives SD− low such that FET T4 is normally on and FET T3 is normally off. As a result, the regulated voltage is reduced by a diode drop (~0.7V) across diode D3 to supply a DC voltage supply component VS of about 4.0 or 5.7 V DC at the PS-BDSI pin.

As illustrated in FIG. 4b, logic signal EDR from U1B holds the gate of P-channel enhancement mode FET T1 low so that T1 is normally on. The DC supply voltage VS is reduced by ~0.7V across diode D1 to charge energy storage capacitor C1, typically 1–10 UF, to generate an internal supply voltage Vcc substantially equal to VIN, typically, 3.3 or 5 VDC. The preferred embodiment utilizes a transimpedance amplifier, which requires a power supply of 3.3VDC. TIAs with 5VDC requirements are presently available and future products with 2.5VDC and even lower voltage supply requirements are anticipated and could be incorporated into the invention with minor changes.

Figure 1:
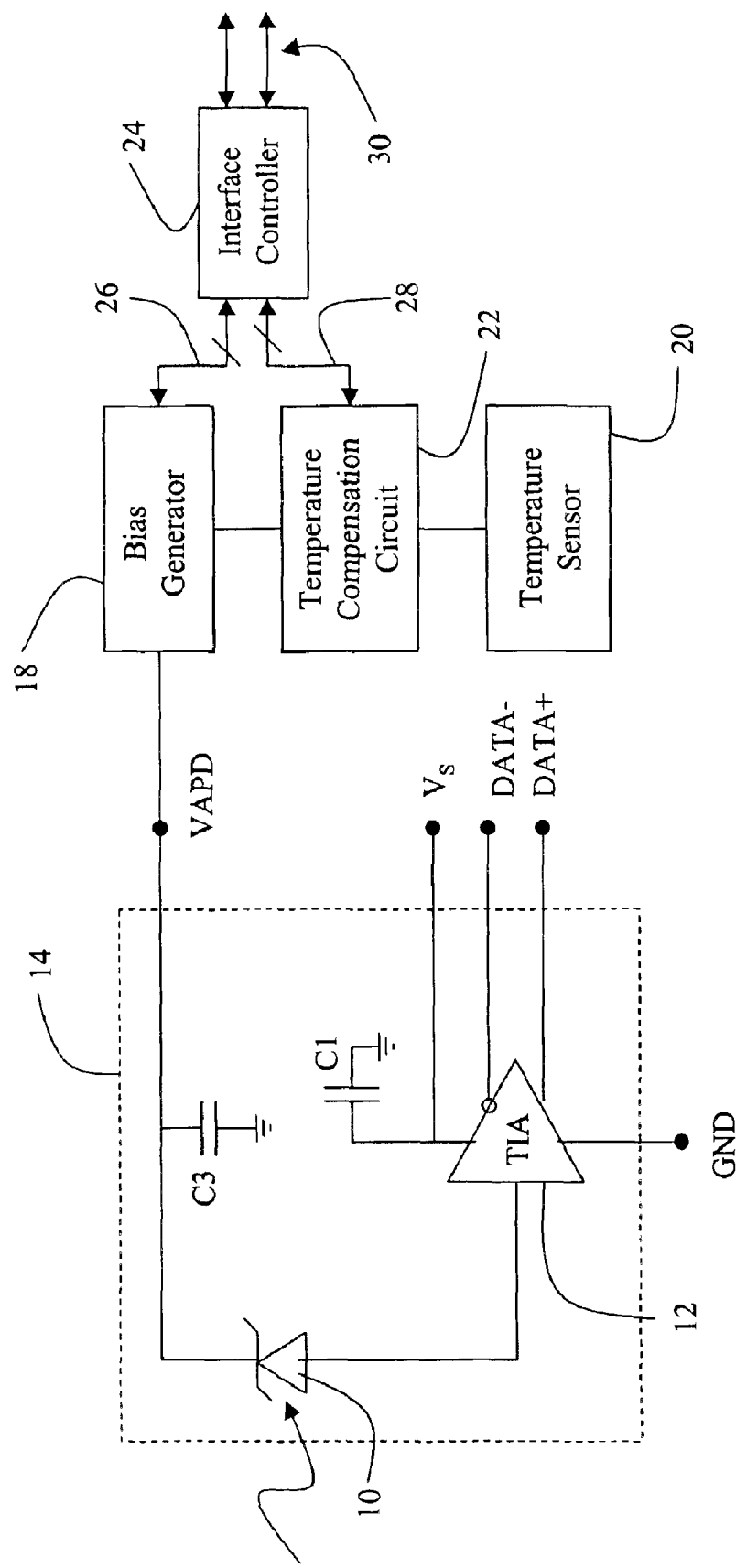
FIG. 1, as described above, is a functional block diagram of a typical 5-pin APD package with external bias voltage and temperature compensation circuitry.
Figure 2:
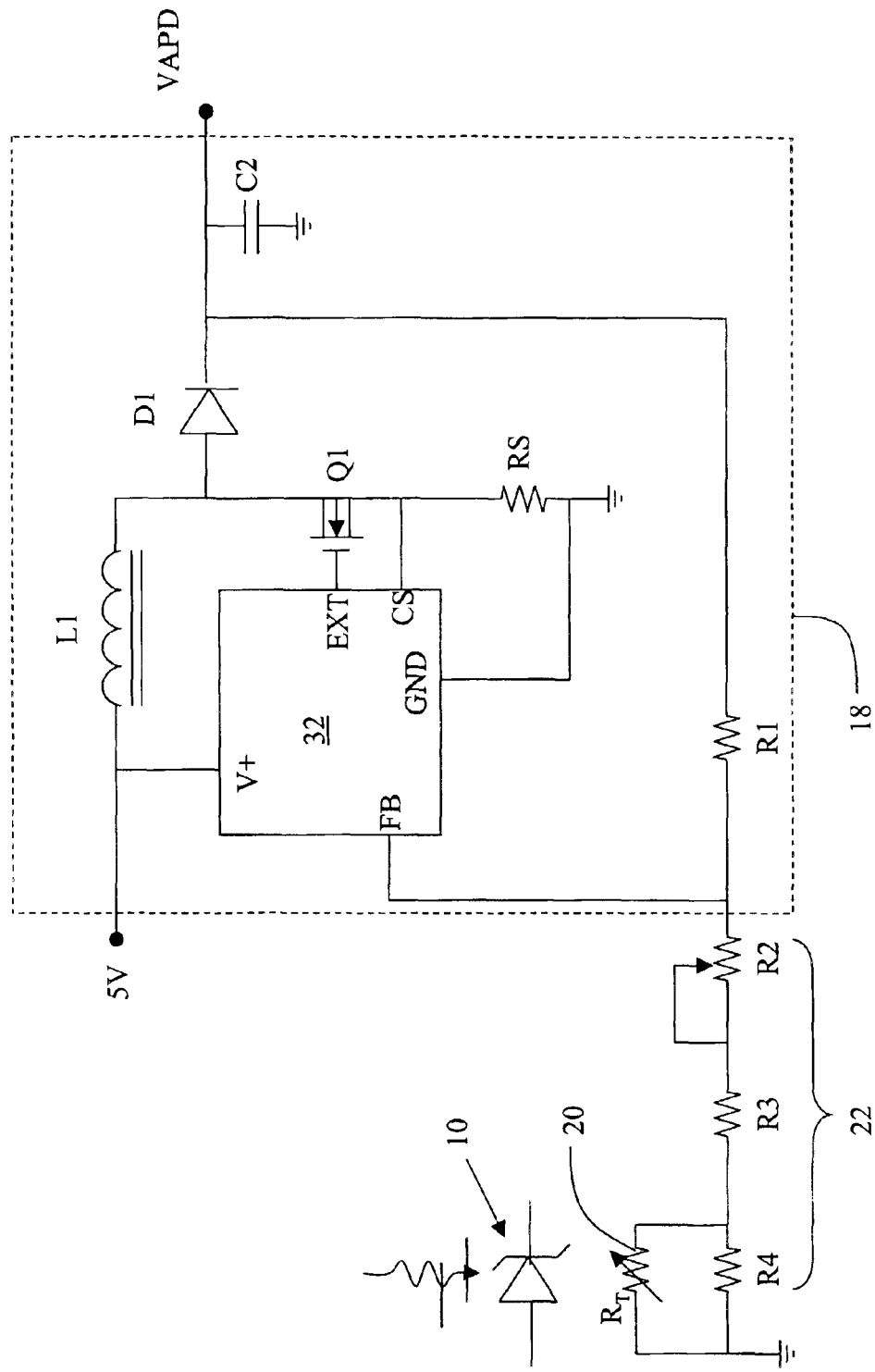
FIG. 2, as described above, is a schematic diagram of a typical bias voltage and temperature compensation circuit.

The bias circuitry working in a manner similar to that described in FIG. 2 produces a high APD bias voltage VAPD, typically in the range of 40–70VDC via the flyback effect. The high voltage is generated when PWM Controller U1A cycles the FET T2, acting as a switch, from "ON" to "OFF" by turning off its gate drive voltage. The current through inductor L1 changes instantaneously, causing a high transient voltage proportional to L(di/dt) to appear at the anode of diode D2, which is then rectified by D2 and stored by the charge storage capacitor C2, typically 1–2.2 UF. As successive cycles of FET T2 are completed, charge is built up on storage capacitor C2 and a limited amount of current may be supplied at a higher voltage, VAPD. The circuit uses a feedback connection from the VAPD output to control the duty cycle of the pulses via the PWM controller, thus controlling the VAPD output. This voltage, which may be quite noisy, is passed through dual output regulator U1C, which produces the well-regulated VAPD that reverse biases APD 54. Storage capacitor C3, typically 10–400 pF, is charged to hold VAPD across APD 54 and filter out any high frequency noise. The regulator also produces a high voltage logic supply VL(typically 2×VIN), which is used for data transfer from the APD/TIA hybrid acting as a Slave, back to external interface controller 70 serving as a Master.

As described previously, the gain and noise performance of the APD is sensitive to fluctuations in temperature. To maintain stable gain and low noise, the bias voltage VAPD must be adjusted as a function of temperature. Temperature sensor 62, which is placed in thermal contact with APD 54, provides temperature data to the PWM controller U1A, which includes a table of temperature correction coefficients, APD bias compensation coefficients and received power correction coefficients, i.e. the data stored in the addresses referenced in FIGS. 5a–5e. The PWM Controller adjusts the duty cycle of the pulses to either raise or lower VAPD to compensate for temperature fluctuations.

Many applications want or need to know the sensed optical power at the APD. This data can be used to determine whether, for example, the transmitter at the far end of the fiber optic link is working properly. The optical power is sensed by inserting a sense resistor RSENSE between the regulator U1C and the APD and measuring the voltage drop across RSENSE with amplifier A1. Since the current through RSENSE is essentially only the DC component of $I_p$ due to filtering elements U1C and C3, this voltage will be proportional to the average received optical power. This data is corrected via coefficients stored in U1A and readout through the bi-directional 1-wire serial interface circuit 66 during data transfer mode.

Data Transfer and Data Return Verification Modes

In the data transfer mode, external interface controller 70 and bias control ASIC 72 pass control data back-and-forth via the bi-directional 1-wire serial interface and the PS-BDSI pin. During data transfer, the controller and ASIC must accomplish two distinct tasks. First, they must effectively transfer the required data back-and-forth via the single PS-BDSI pin without conflict. Second, the internal supply voltage Vcc and the APD bias voltage VAPD must be maintained without significant degradation even though the power supply is temporarily interrupted to the package.

There are a few key functions that are implemented by the circuits shown in FIGS. 4a–4c to achieve these tasks. First, a data structure such as shown in FIGS. 5a–5e is used to format the data. The data structure includes, for example, 2 synchronization bits that tell the receiver that data is coming and provide a timing reference for the recovered clock, 2 control bits that tell the receiver what type of operation, e.g. read or write is being performed, 8 address bits and 8 data bits. Second, a global timing sequence as shown in FIG. 6 allocates time DTV (Data Transmission Valid) for external interface controller 70 to transmit data and time DRV (Data Response Valid) for ASIC 72 to transmit data with the rest of the time allocated for normal operation to recharge the storage capacitors in the APD package. Third, three voltage levels are used to communicate binary data back-and-forth with the mid or normal level at a nominal level of (VS) VDC representing a binary 1 when external interface controller 70 (Master) is sending commands or requests to internal ASIC 72 (Slave). The mid or normal level VS represents a binary 0 when ASIC 72 is sending responses to external controller 70. External interface controller 70 drives the PS-PDSI pin low to send a binary 0 and to the normal supply voltage level VS when sending a binary 1. Bias controller ASIC 72 drives the pin high to voltage VL to send a binary 1 and to the normal supply voltage level VS when sending a binary 0. Note, the circuitry could be designed so as to reverse or invert the logical definitions as described above. Fourth, the circuitry operates at much higher frequencies than conventional APD bias circuits, at least 1 MHz and typically 3–5 MHz, so that the voltages stored in the smaller capacitors do not degrade appreciably during the power supply interruptions associated with either data transfer mode. This high frequency operation necessitates modifications that are embodied in the circuitry, primarily switch networks (FETS T1, T3 and T4) which isolate the charge storage capacitors C1 and C4 during switching to avoid the rise/fall time penalty associated with charging and discharging them and the attendant sacrifice in power efficiency. Fifth, the data transferred between external interface controller 70 and ASIC 72 is encoded using, for example, Manchester encoding to provide a clock signal embedded in the data stream. This embedded clock signal is recovered from the Manchester encoded data by the target device and used to clock in the encoded data. The use of Manchester encoding means ASIC 72 and external interface controller 70 do not need to maintain precise, stable, and equal internal reference clocks for the purpose of transferring data. Though Manchester encoding is used in the presently preferred embodiments, other encoding schemes which facilitate clock and data transmission via a single wire may be used such as scrambling, block coding, non-return to zero (NRZ), return to zero (RZ), etc.

To understand how the circuitry functions let us look first at how external interface controller 70 sends a binary 0 by pulling the PS-BDSI pin low and then how ASIC 72 sends a binary 1 by forcing the PS-BDSI pin high with reference to FIGS. 4a–4c.

During a scheduled DTV slot determined by it's internal timer, external interface controller 70 pulls the voltage on the PS-BDSI pin low by energizing the n-channel enhancement mode MOSFET T3, which acts as a switch. T3 is energized by a voltage high on Serial Data signal SD– from timing and control generator U2A acting on its input gate. Energizing T3 pulls the PS-BDSI line low corresponding to a binary 0. During the time T3 is energized, p-channel enhancement mode MOSFET T4 is shut off by the high voltage level from SD– acting on its input gate, thereby disconnecting energy storage capacitor C4 from T3 and the PS-BDSI line.

Inside the APD package, driving the PS-BDSI line low reverse biases diode D1, which prevents any positive charging of the PS-BDSI line and isolates capacitor C1 so that it does not discharge through T1 and T3 to ground. In this manner, the PS-BDSI line can be pulled low much faster and held low for a much shorter period of time than if C4 and/or C1 were continuously connected to the PS-BDSI line.

Energy storage capacitor C4 rapidly charges C1 inside the TO-46 electronics enclosure to VS-0.7VDC once the SD-output data signal has been reversed and is driven to a low voltage near 0VDC, turning T3 off, and T4 on. Once SD− is at or near 0VDC and T3 is off and T4 is on, the PS-BDSI line rapidly charges to the normal supply voltage VS. Upon the completion of this cycle, a binary 0 is considered to be transferred to the bi-directional Encoded Data Transmit/Encoded Data Response (EDT/EDR) input/output line of U1B inside the TO-46 electronic enclosure. To complete the transfer of data during a DTV slot, numerous cycles as described above must be completed with the specific data structure and timing as shown in FIGS. 5a–5e and 6.

Similarly, when the response to a data request is ready and scheduled for a DRV slot, the presence of a binary 1 will be signaled by the Encoded Data Response EDR output of signal logic U1B. A minimum delay, suitably 8 clock cycles, is provided for by U1A after the completion of a DTV time period and before the beginning of a DRV time period. The EDR output of U1B signals a binary 1 by raising the voltage of the PS-BDSI line to the high voltage logic level VL. The threshold voltage VREF for the comparator U2D reference input used to sense this digital signal is set at a level halfway between the nominal input supply DC voltage VS at the PS-BDSI pin (typically 4.0–5.7VDC) and the high voltage logic supply VL (typically 6.6–10VDC). This level would be 5.3VDC when 3.3VDC is applied at VIN voltage input on timing and control generator U2A, U2C portions of the circuit outside the TO-56 electronic enclosure. Similarly, when 5VDC is input at VIN, VREF would be set at 7.85VDC. This level is generated by the resistive divider formed by R2, R3 and filtered by capacitor C5.

During a binary 1 output from slave device ASIC 72 as described above, p-channel enhancement mode MOSFET T1 will be switched off by the presence of a high voltage VL at it's input gate. This reduces the enhancement voltage between the gate and the FET T1's source which is connected to the EDR/EDT line and causes the P channel FET to switch off, isolating energy storage capacitor C1 from the PS-BDSI line, thereby allowing for a fast rise and fall time of the binary 1 pulse. Were switch T1 not to disconnect capacitor C1, much of the available signal current from the EDR/EDT input/output line now acting as an output would be wasted charging and discharging C1, greatly increasing the rise/fall times of the binary 1 signal. Also, diode D3 in external interface controller 70 will be reverse biased by the high voltage logic signal driven by EDR, hence disconnecting energy storage capacitor C4 from the PS-BDSI line. By disconnecting both C1 and C4 during the high voltage binary 1 output from EDR/EDT acting as output line of U1B, a fast pulse rise and fall time may be maintained (typically 5–10 ns) so that a digital pulse of 50 ns may be reliably transmitted and detected by the Digital Input (DI) line on comparator U2D.

Data Structure

Figure 5A:
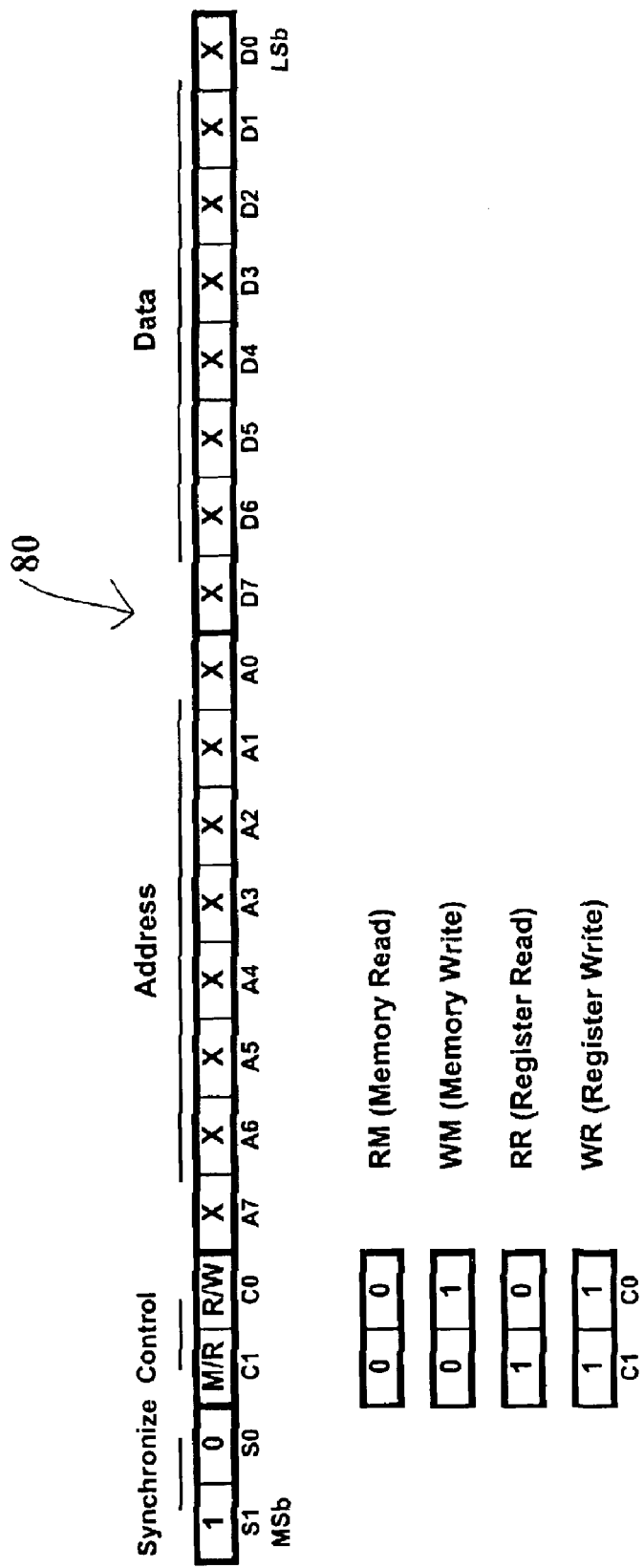
FIGS. 5a through 5e are diagrams of a suitable data structure.
Figure 5B:
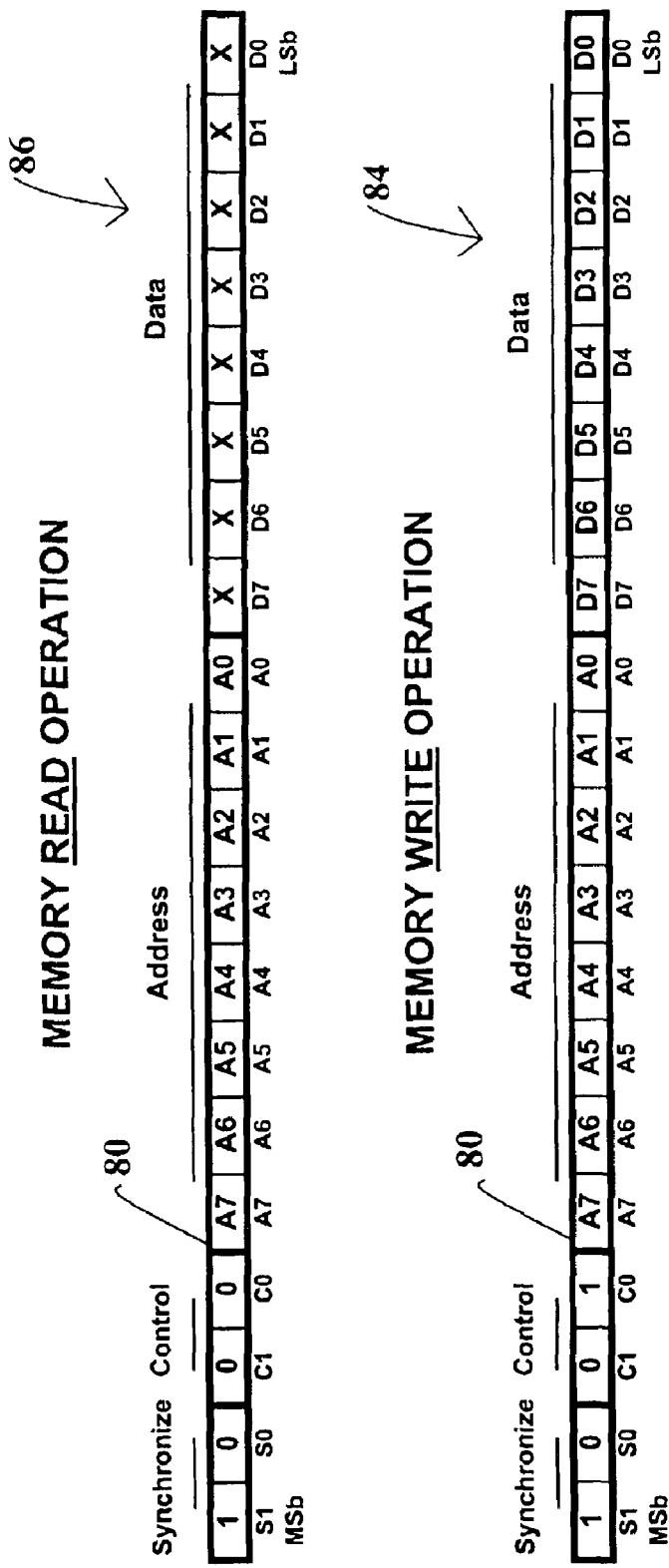
Figure 5C:
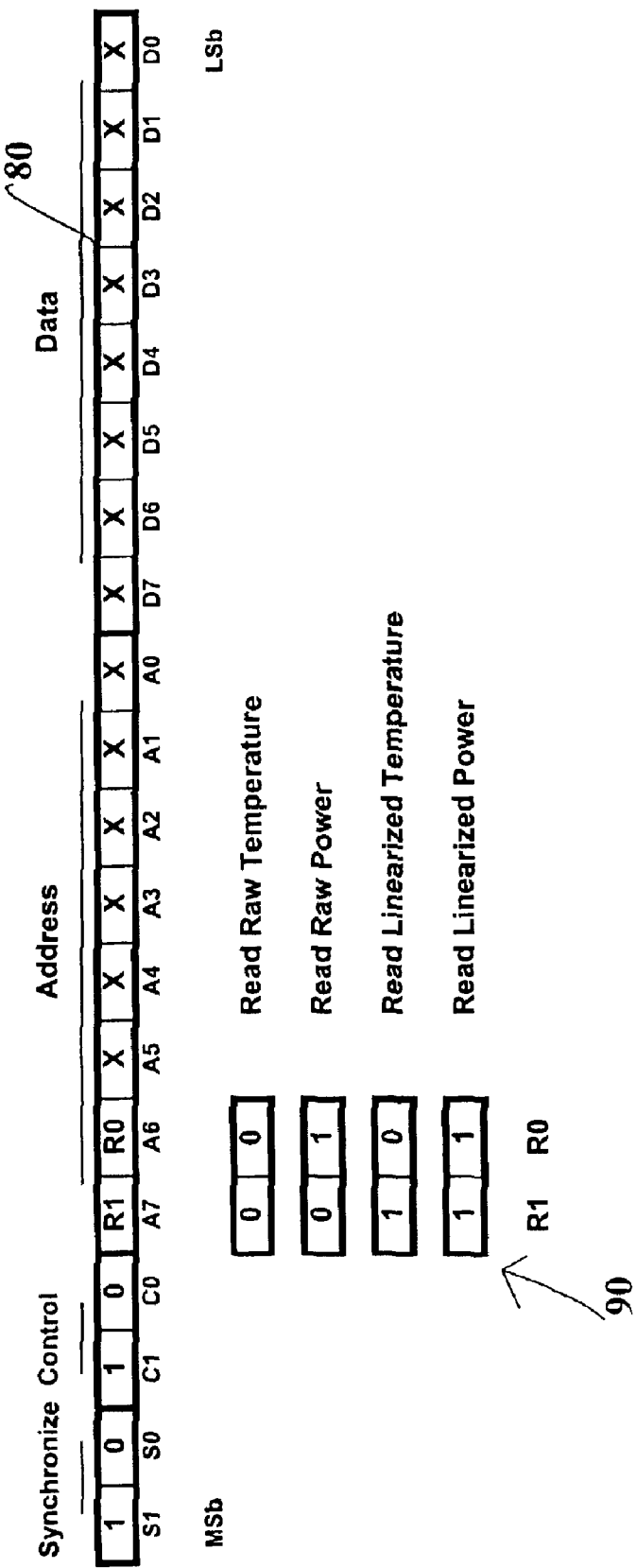
Figure 5D:
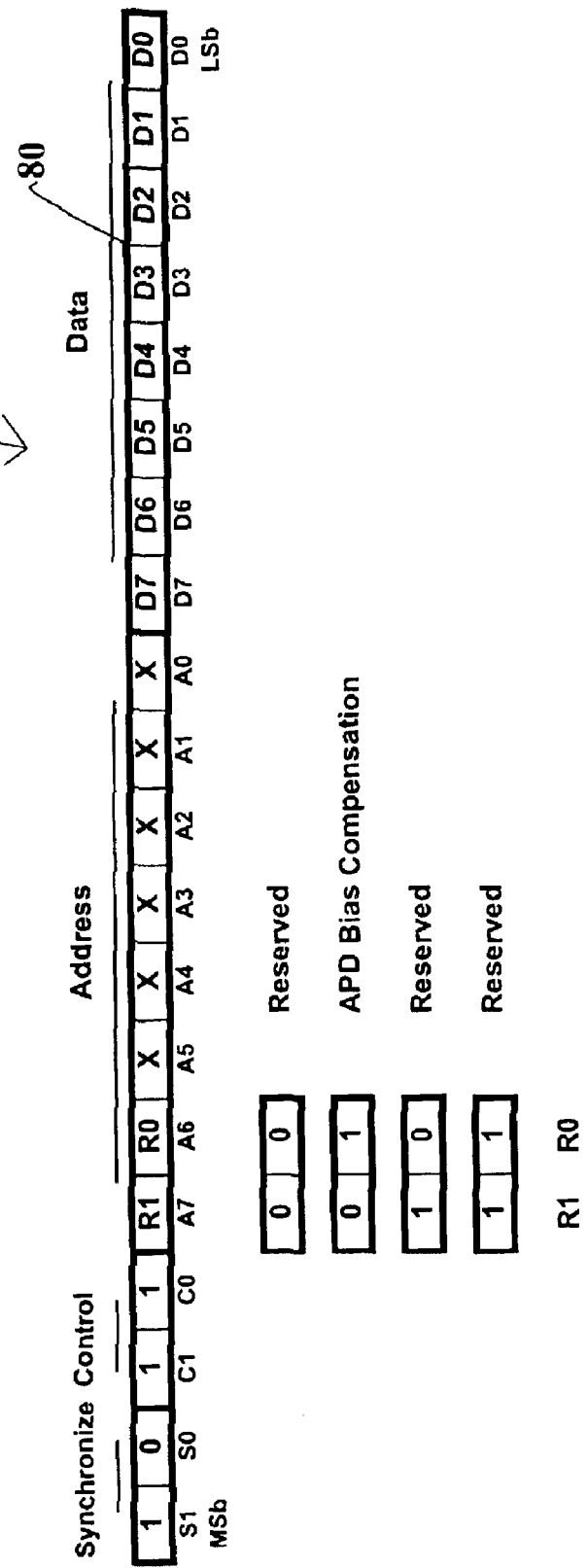
Figure 5E:
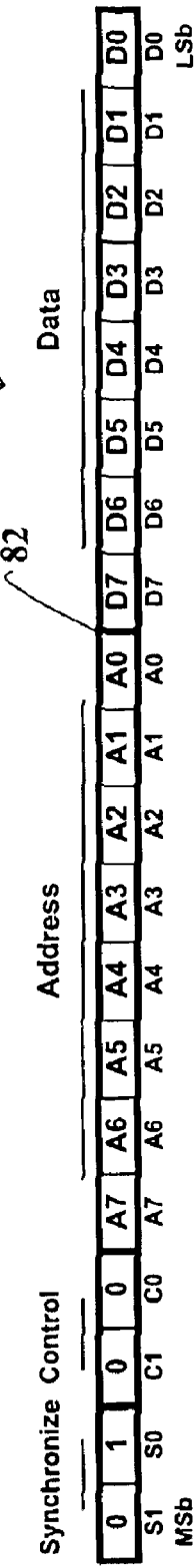
Figure 5E:
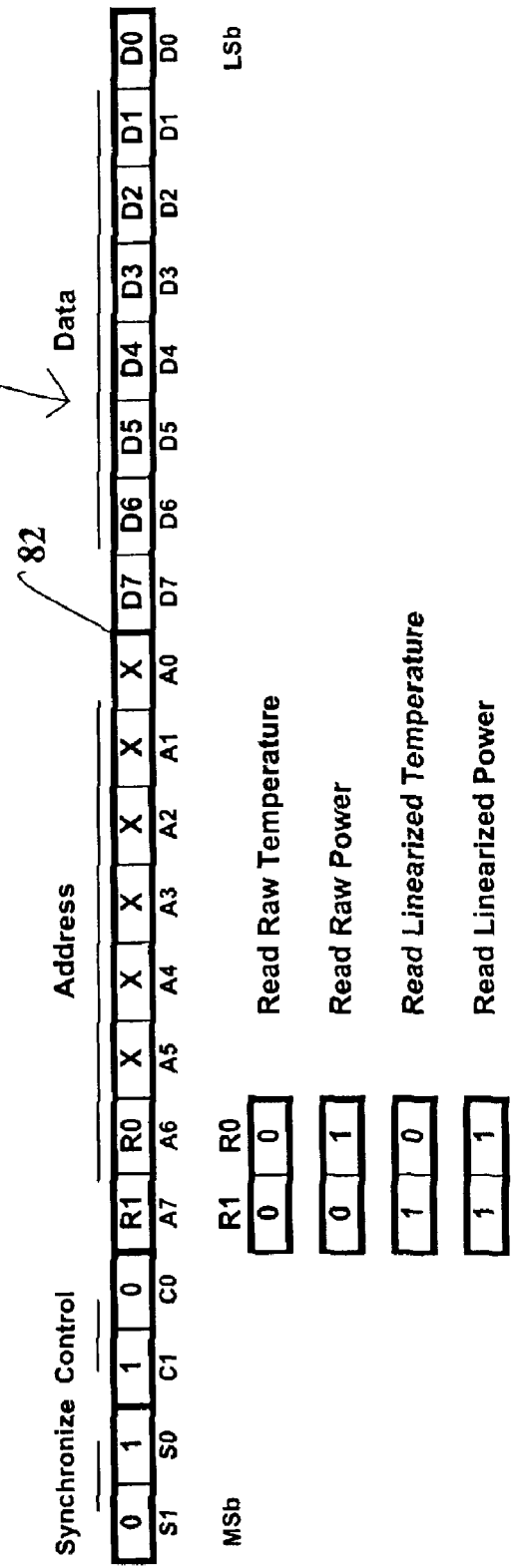
Figure 6:
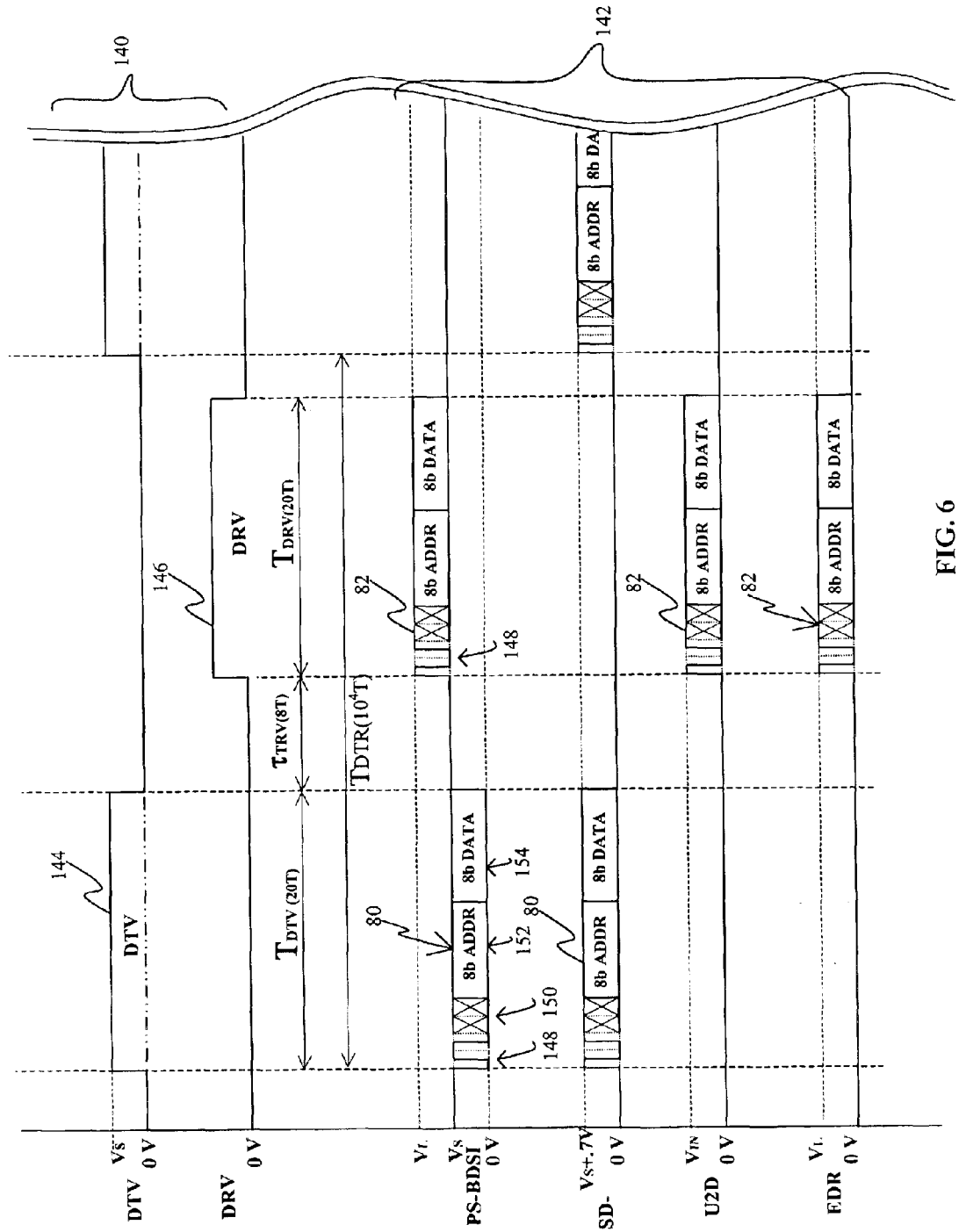
FIG. 6 is a timing diagram showing the voltage waveforms at the power supply and bi-directional serial interface (PS-BDSI) connection.

FIGS. 5a through 5d illustrate the data structure of a Master Transmitted Word (MTW) 80 sent from external interface controller 70 to bias controller ASIC 72 operating in slave mode and FIG. 5e illustrates a Master Received Word (MRW) 82 data structure transmitted from bias controller 72 and received at external interface controller 70 operating as master. Specifically, FIG. 5a details a 20 bit MTW 80 comprised of, for example, 2 leading synchronization bits, 2 control bits specifying which of four memory/register read or write actions are to be taken, 8 address bits specifying a location in non-volatile memory, and 8 data bits comprising either APD compensation coefficients, temperature sensor linearization factors, or APD photocurrent linearization factors. Bias control ASIC 72 suitably contains 256 bytes of non-volatile memory containing compensation coefficients and correction factors as outlined above. ASIC 72 also utilizes a set of volatile registers that contain the actual operating values of temperature, optical input power, and compensated APD bias level at any given moment. Either memory or register read and write operations are provided for by the MTW word structure and by the internal circuit connections of ASIC 72.

FIG. 5b illustrates the memory write and read operations 84 and 86, respectively. The APD/TIA/ASIC hybrid package will nominally be operated at a number of discrete temperatures between −40 to +88 degrees C. During a factory calibration sequence, at each of perhaps 16 temperatures equally spaced every 8 deg. C, a register read operation 88 reads a raw temperature value from it's register using the command sequence 90 in FIG. 5c with the control bits C1, C2 set to 1,0, respectively. Furthermore, R1, R0 of the address field will be set to 0,0 to indicate to ASIC 72 a read of raw temperature data is desired. The raw temperature data is returned as Master Received Word (MRW) 82 as shown in FIG. 5e. FIG. 5e details the structure of both non-volatile memory and register read response operations 92 and 94, respectively, to transmit MRW 82 back from bias controller ASIC 72 to external interface controller 70.

When this raw temperature data is compared to the reading from a calibrated instrument, the temperature correction factor will be calculated by the user and downloaded to the corresponding non-volatile memory address. At present, the lower 128 bytes of non-volatile memory are reserved for APD compensation coefficients. The next 64 bytes are for temperature sensor correction factors, and the last 64 bytes are reserved for the APD photocurrent linearization factors. To complete the table of temperature linearization factors, a calculation will be made to interpolate between the perhaps 16 readings and the table will be filled in by succeeding cycles of the memory write operation controlled via external interface controller 70 and user supplied automated test equipment and software communicating with controller 70 via the I2C serial interface and signals SCLCK and SDATA, respectively. Alternatively, temperature sensor 62 may be linearized by on-chip trimming at the factory. In such case, the above temperature sensor linearization sequence need not be completed and the associated non-volatile memory may be eliminated or reassigned.

Once the corrected temperature is found, a calibrated optical power meter reads the incident optical power at each of the 16 discrete temperatures. This value is compared with the data returned from the volatile APD photocurrent data register via a register read (RR) operation 88 as shown in FIG. 5c (R1,R0=0,1) and photocurrent linearization correction factors are calculated and entered into the appropriate non-volatile memory locations via memory write (WM) commands (C1,C0=0,1) as illustrated in FIG. 5b. Interpolation fills in the values between measured data, making use of the necessary number of memory write cycles. Again, this process can be substantially automated during this set-up and calibration mode by the use of automated test equipment and software communicating with external interface controller 70 via the I2C serial interface.

A similar process is used to generate APD bias compensation coefficients with a notable exception. Based on the temperature and known APD characteristics, a trial value of APD bias voltage is calculated and written to the volatile APD bias register (C1=C0=1, and R1,R0=0,1) via a register write (RW) operation.

FIG. 5d details the data word structure 96 of the register write (WR) operation. Measurements of the optical receiver sensitivity and Bit-Error-Rate (BER) will be made, and a new optimized value of APD bias voltage calculated. The new optimized value of APD bias voltage is written to the volatile APD bias register as described above and the receiver sensitivity and BER measurements repeated. When a final value is determined after a number of optimization cycles, the APD compensation coefficient value is written to the appropriate address corresponding to the current raw temperature in the non-volatile memory table via a memory write cycle (WM) with the data word structure as detailed in FIGS. 5a, 5b and with the lower 128 bytes of non-volatile memory addressed.

The logical operations are defined by the data word structures in FIGS. 5a–5e. To fully understand the operation of the interface, it is necessary to contemplate the signal encoding method. The means for driving the PS-BDSI line above its quiescent state (VS) by the encoded data response (EDR) signals sent from bias control ASIC 72, and the means for pulling PS-BDSI low used by external interface controller 70 when sending encoded data transmission (EDT) signals to the bias control ASIC 72 have been adequately described. The encoding method used will create a visual difference between the logical value of the data bit as shown in FIGS. 5a–e and the actual signal voltage waveforms plotted in the FIG. 6 timing diagram.

Embedded Clock Signal

A clock signal is preferably embedded in the control data to synchronize the APD (slave) with the external controller (master). The EDT and EDR digital signals are suitably encoded with a 1B/2B digital Manchester encoding to embed a clock signal in the control data. This code is produced by an exclusive OR operation between the data bit and the originating device's data clock signal. A binary 1 will thus have a 0 pulse in the leading half of the bit period, and a 1 pulse in the trailing half of the bit period. Conversely, a binary 0 will have a 1 pulse in the leading half of the bit period, and a 0 pulse in the trailing half of the bit period. Thus, the pulse widths observed on the PS-BDSI line may be as short as ½ the width of the data bit period. The data bit period (T) is defined as the length of a full data clock cycle. Because the clock is encoded in the signal, there is no need to have accurate, synchronized clocks on both sides of the serial interface.

The clock signal needed to clock in the data being transferred can be recovered easily from the data using a D flip-flop in a 3-pulse decoder configuration well known in the prior art. To properly synchronize the phase of the recovered clock, there must be a transition in the data bit stream from binary 1 to binary 0 or from binary 0 to binary 1. Therefore, as provided for in the presently preferred embodiment the leading 2 synchronization bits align the proper phase of the recovered clock with the decoded data. The data is decoded by properly aligning the recovered clock with the incoming Manchester encoded data and simply clocking the data in to a D type flip-flop or serial input register. The essential issue is where in the signal to position the recovered clock. Improper phasing of the recovered clock can result in an inversion of the data. The described method of using the 2 leading bits in the word as synchronization bits with a guaranteed transition between the first and second bit, overcomes this potential problem.

This provides for an unambiguous method of controlling the passing back and forth of data across the PS-BDSI one-wire bi-directional serial interface. By observing the polarity of the synchronization bits (1,0) as detailed in FIGS. 5a–d, or the (0,1) of FIG. 5e, it is possible to know instantaneously the transmission mode, i.e. whether the signal is a master transmit word (MTW) 80 or a master received word (MRW) 82 as a result of a request for data from bias control ASIC 72 acting as slave. Moreover, this reversal can be useful if identical circuits are to be used within both Master and Slave for recovering the clock and synchronizing the clock with proper phase relationship to the incoming data.

Figure 7:
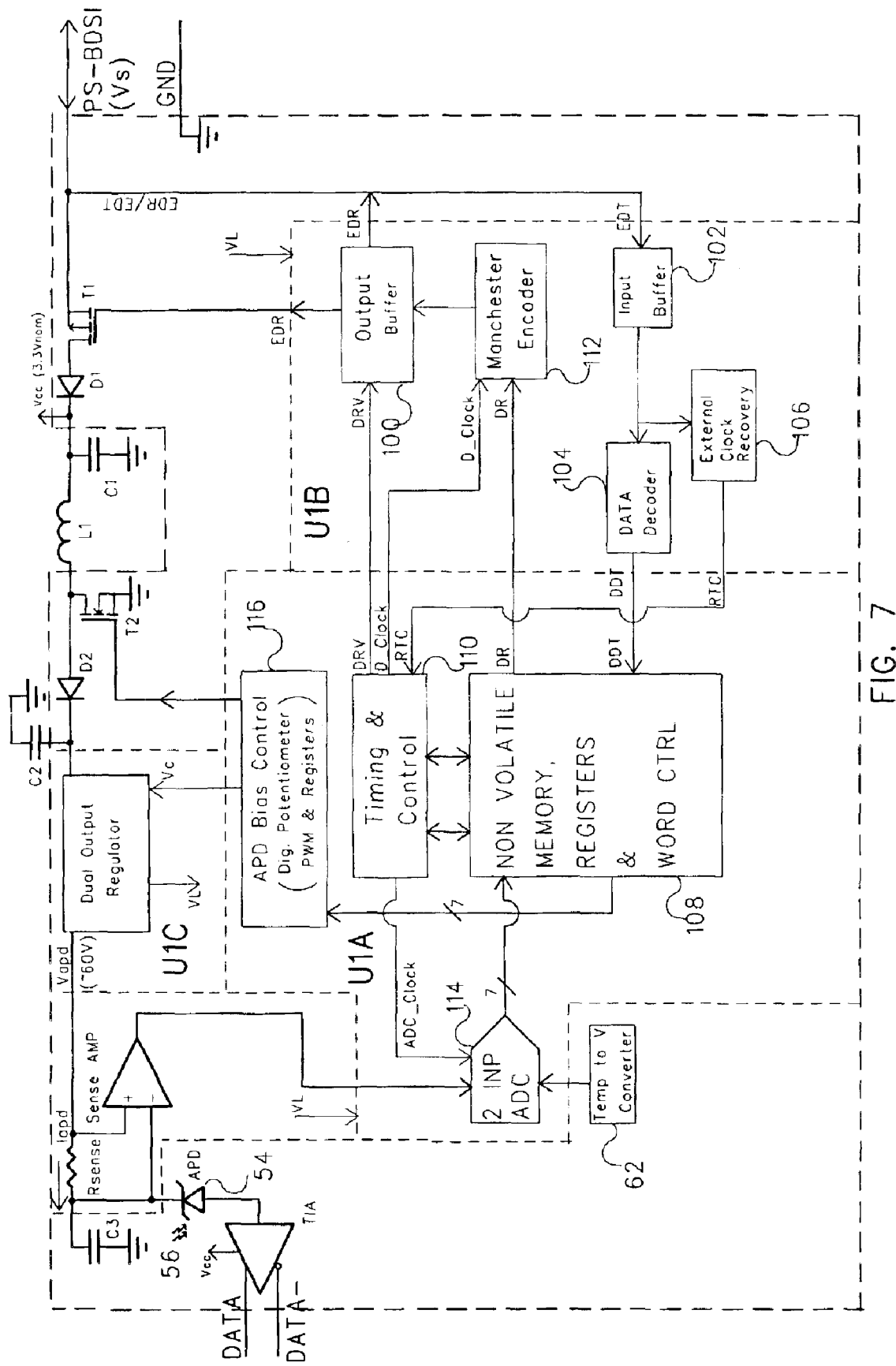
FIG. 7 is a block diagram of the bias control ASIC (Slave) operating inside the APD/TIA hybrid package.

As shown in FIG. 7, using the above-described mechanism for Manchester encoding Master Transmit Words (MTW), external interface controller 70 initiates control data and data requests to bias control ASIC 72. Within APD bias controller 72, the EDT/EDR line is a connection of a input of a high input impedance (EDT) buffer 102 with the output of a tri-stateable (EDR) buffer amplifier 100 within U1B. The tri-stateable EDR buffer 100 is normally in its high impedance, or isolated mode. The output of the EDT buffer is connected to the Manchester decoder logic 104 and clock recovery circuit 106. This decoded transmit data (DDT) and recovered transmit clock (RTC) is then passed from U1B to the serial input register of U1A.

Conversely, the output of the tri-stateable buffer which drives signal EDR is normally in it's high impedance state, as APD bias controller ASIC 72 is a slave, and normally in the listening mode. This line is driven high to logic level VL only when DTV has expired, at least 8 additional bit periods have elapsed ($\tau_{DRV}$), and a DRV window has been opened (see FIG. 6) by the internal timing logic within bias control ASIC 72. The U1A internal timing circuit asserting the DRV signal to the enable input of the EDR output buffer establishes this DRV window. Manchester encoder 112 encodes Data Response (DR) signal bits with a 1B/2B code as described previously, except the APD bias controller data clock (D_Clock) is used to encode the data response from ASIC 72. The response data are decoded and entered in to a serial-in register on external interface controller 70 (Master) in the same manner as described above for internal APD bias controller 72 (Slave). In this manner, the voltage waveforms observed on the PS-BDSI line shown in FIG. 6 are generated.

Timing Diagram

FIG. 6 illustrates the global timing 140 provided by DTV and DRV timing periods. FIG. 6 also details voltage waveforms 142 at the PS-BDSI pin, the Serial Data signal SD-from U2A, the output of comparator U2D and the Data Response DR output of U1B for a typical instruction sequence. External interface controller 70 generates a DTV signal 144 sufficient to allow for the serial data transmit present at the cathode of diode D3 (D3C) signal to pass a complete Master Transmit Word (MTW) 80, suitably 20 clock periods long ($T_{DTV}$=20T) of a complete transmit and response instruction cycle $T_{DTR}$ suitably $10^4$ clock periods. This DTV period is reproduced internally in bias control ASIC 72 by simply counting the recovered clock pulses on the Recovered Transmit Clock (RTC) line. During this time, no Data Response (DR) signals are allowed to propagate by bias control ASIC 72 and no response data will be decoded at external interface controller 70 until DTV has expired and the delay $\tau_{TRV}$ of an additional 8 clock periods (8T) minimum has passed. Subsequently, APD bias controller 72 then generates a DRV signal 146 sufficient for a DR signal to pass a complete Master Receive Word (MRW) 82, suitably 20 clock periods long ($T_{DRV}$=20T).

FIG. 6 shows the details of a MTW 80 which is 1B/2B Manchester encoded and superimposed on the Power Supply and Bi-Directional Serial Interface (PS-BDSI) line. The leading synchronization bits (1,0) 148 of a MTW appear as a 0110 sequence with each pulse of the 0110 sequence being ½ of the width of a bit period T. Dotted lines show the actual bit boundaries of the encoded data. Next, the two control bits 150 are shown as XX (indeterminate) since they may vary depending on the type of operation specified by external interface controller 70. After the control bits, the 8 address bits 152 and the 8 data bits 154 come in sequence. All are 1B/2b Manchester encoded as are the synchronization and control bits, though the diagram does not show the details of the Manchester encoding for address and data bits for the sake of clarity. The low level corresponding to a binary 0 is at or near 0VDC and the high level corresponding to a binary 1 is at or near (VS)VDC during the MTW transmission.

After a minimum delay of 8T($\tau_{DRV}$, at or near (VS)VDC, the PS-BDSI line is driven high by the response from the internal APD bias controller transmitting a MRW response. A significant difference is the synchronization bits 148 polarity reversal to (0,1) which creates a 1B/2B Manchester code 1001 with each of the code pulses lasting for only ½ of a data bit period T. This detail is shown by the dotted lines showing the data bit boundaries. The remainder of the structure of 2 control bits, 8 address bits, and 8 data bits is transmitted as described earlier, with all bits 1B/2B Manchester encoded, though some detail omitted in the diagram for the sake of clarity. The high level associated with a binary 1 is (VL)VDC, and the low level associated with a binary 0 is (VS)VDC. When the MRW data response transmission sequence is completed by bias control ASIC 72, it returns to its normal slave mode by driving PS-BDSI line back to the nominal (VS)VDC, and begins to listen for master commands from external interface controller 70.

The signal at SD- is a replica of the MTW portion of the signal at PS-BDSI except that SD- is only allowed to traverse between 0VDC and (VS+0.7)VDC. SD- is blocked from the high voltage logic level VL by diode D3 and only needs to operate against this lower voltage level present at storage capacitor C4 and the source connection of FET T4. If SD- rises to (Vs+0.7)VDC, it is sufficient to solidly turn FET T4 to it's OFF or isolated state.

The output of comparator U2D is the same in timing as the MRW signal pattern on the PS-BDSI line except the amplitude is different and shifted to a lower baseline level. The function of this comparator is to strip off any incoming MRW signals from the PS-BDSI line and feed them directly to the U2A input at the appropriate logic voltage levels of 0VDC and (VIN)VDC, where 0VDC corresponds to a binary 0 and (VIN)VDC corresponds to a binary 1.

The EDR signal is applied to the gate of FET T1 and works in concert with input/output line EDR/EDT now switched to output mode for transmitting MRW responses back from bias control ASIC 72 to external interface controller 70. EDR has a level at or near (VL)VDC corresponding to a binary 1, and a level of 0VDC corresponding to a binary 0. The voltage level VL is double the input voltage VIN input to external interface controller 72. The timing of the pulses on the EDR line and the arrangement of the MRW word structure are identical with U2D and PS-BDSI. This voltage should rise to the level of (VL)VDC during a EDR pulse to properly turn off FET T1 within a DRV period so that C1 will be isolated from the PS-BDSI line.

Internal Structure of ASIC and External Controller

FIG. 7 illustrates a suitable internal structure of ASIC 72. The tri-stateable output of EDR output buffer 100 within U1B is connected to the same line as the EDT input line to MTW input buffer 102 within U1B. This EDR/EDT line is then connected to the source terminal of FET T1 and the PS-BDSI line. During operation in normal slave mode, EDR output buffer 100 is in a high impedance mode, allowing the EDR/EDT line to be driven by external interface controller 70 through the PS-BDSI line. FET T1 is in a low impedance, or on state, allowing storage capacitor C1 to charge through rectifying diode D1. A Data Decoder 104 and an External Clock Recovery 106 operating in concert within U1B decode buffered EDT signals sent by external interface controller 70 during a DTV period. The decoded data transmitted signals (DDT) are then passed to the Non-Volatile Memory Registers and Word Control (NVMRWC) circuit 108 of U1A. The Recovered Transmitted Clock (RTC) is also passed to NVMWRC circuit 108 within U1A to begin the internal timing of the DTV period.

Once the DTV transmission period is complete, the Timing and Control (TC) circuit 110 within U1A may initiate a response after an additional number of at least 8 clock cycles ($\tau_{TRV}$). If no response is called for, ASIC 72 continues to wait in normal listening (slave) mode for the next command from external interface controller 70. If a response is required, timing and control circuit 110 initiates data transfer from non volatile memory, registers and word control circuit NVMRWC 108 within U1A via data response DR line to Manchester encoder 112 within U1B, also supplying the data clock signal (D_clock) to be used in the encoding operation. At this time, timing and control circuit 110 also raises the data response valid DRV signal line as an output enable signal to EDR output buffer 100 within U1B. This output enable signal causes EDR output buffer 100 within U1B to transition to it's active state, driving the EDR/EDT line in accordance with the output of the Manchester encoder circuit within U1B.

The outputs of sense amp A1 and temp sensor 62 are digitized by a two input ADC 114 at each cycle of ADC_ Clock and held in data registers within NVMRWC 108. The appropriate received optical power correction and APD temperature compensation coefficients are read out of non-volatile storage addresses within NVMRWC 108 based on the value of the current temperature. APD temperature compensation coefficients are passed to an APD Bias Control 116, which includes a digital potentiometer PWM and registers. APD Bias Control 116 varies the gate drive to FET T2 to control the duty cycle of the regulated voltage and adjust APD bias voltage VAPD. Raw received optical power data are corrected by the corresponding data within non-volatile storage addresses within NVMRWC 108, and these data are held in output data registers in NVMRWC 108 for transfer to the external interface controller 70 upon request from the master device.

Figure 8:
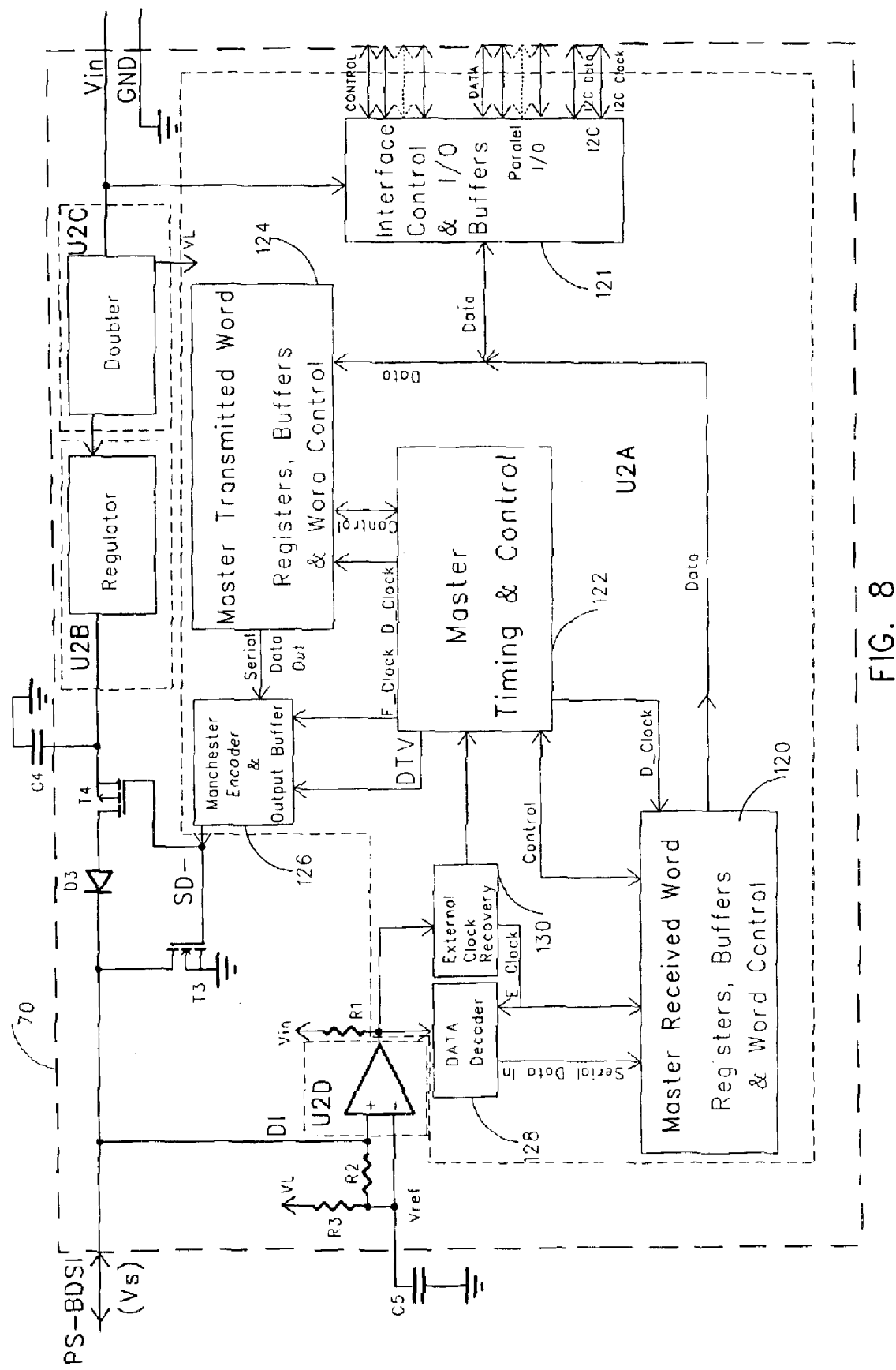
FIG. 8 is a block diagram of the associated external interface controller (Master)

FIG. 8 shows a suitable internal structure of external interface controller 70. When external interface controller 70 is supplying power to ASIC 72, it will drive the SD- output low, switching FET T4 on, and turning FET T3 off, and supplying power through rectifying diode D3 while ignoring any spurious signals incident on the Serial Data In input of the Master Received Word Registers, Buffers & Word Control (MRWRBWC) circuit 120 within U2A. When external interface controller 70 receives a request for APD temperature or incident power from a host device or test equipment (not shown) via either the parallel I/O or serial I2C bus and interface control & I/O buffers 121, the master timing and control (MTC) circuit 122 within U2A initiates transfer of MTW command words from Master Transmitted Word Registers, Buffers and Word Control (MTWRBWC) circuit 124 within U2A to ASIC 72. MTC 122 raises the DTV signal as an enable to the Manchester encoder and output buffer (MEOB) 126, which causes the SD-output signal to follow the output of the Manchester encoder and thereby transfer MTW signals to ASIC 72 via the PS-BDSI line. Upon completion of the DTV period, MEOB 126 will be disabled, forcing SD− to a low state, and a delay of at least 8 clock cycles ($\tau_{TRV}$) will precede the enabling of the MRWRBWC Serial Data In input by the MTC circuit 122. The Serial Data In line of MRWRBWC circuit 120 thus enabled, will be driven by Data Decoder and External Clock Recovery circuits 128 and 130, respectively, within U2A processing MRW encoded data responses from ASIC 72.

4-pin APD Package with Serial-in Communication

In many applications it may not be necessary to have bi-directional communication with the APD; it may be sufficient to have only serial-in capability. In other words, the external controller needs to transmit information and commands to the APD but does not need to read out sensor data via the PS-BDSI pin. The modifications to ASIC 72 and external interface controller 70 are straight forward. In the APD bias controller ASIC 72, FET T1 and the Manchester encode logic and tri-stateable output buffer within U1B are eliminated and the PS-BDSI pin is input via the input buffer, Manchester decode logic and clock recovery to the PWM controller U1A (See FIG. 3). In the external interface controller, comparator U2D and resistor R1 are eliminated. Since the APD/TIA hybrid is not transmitting response data (MRW) they are not needed.

Mechanical Packaging in the 4-pin Can

Figure 9A:
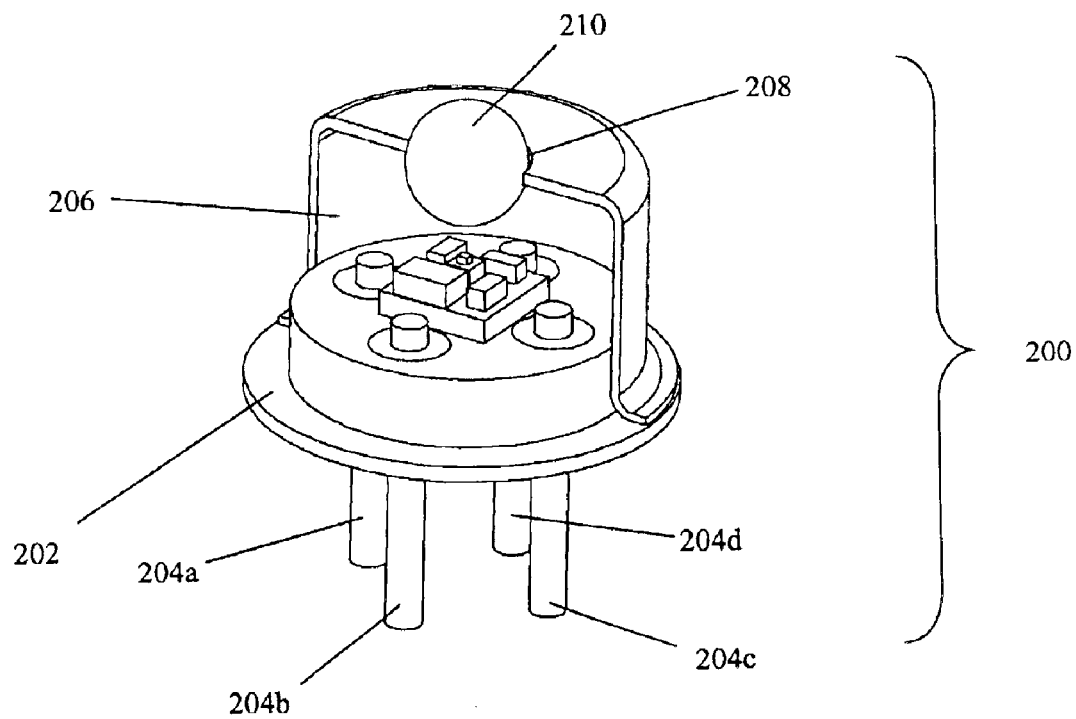
FIGS. 9a and 9b, 10a and 10b, and 11a and 11b are isometric and top diagrams illustrating a standard package, recessed pin package and a three-dimensional spacer package, respectively.
Figure 9B:
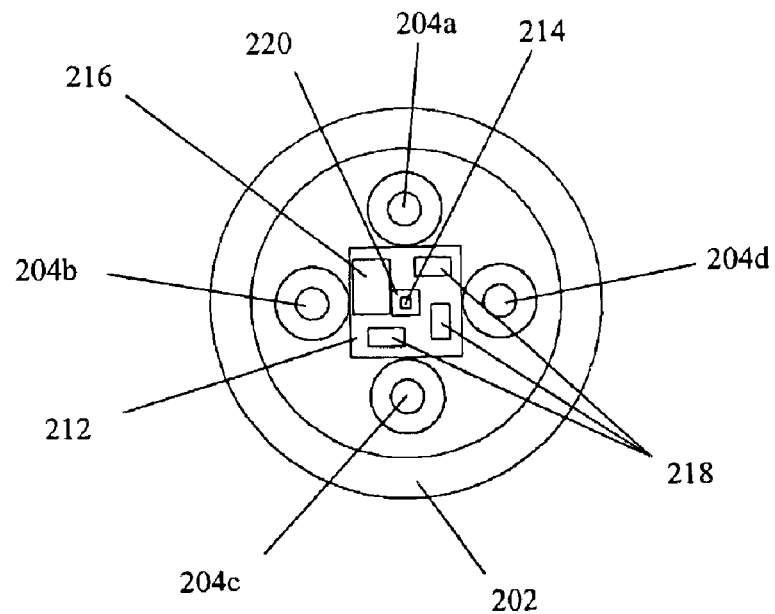
Figure 10A:
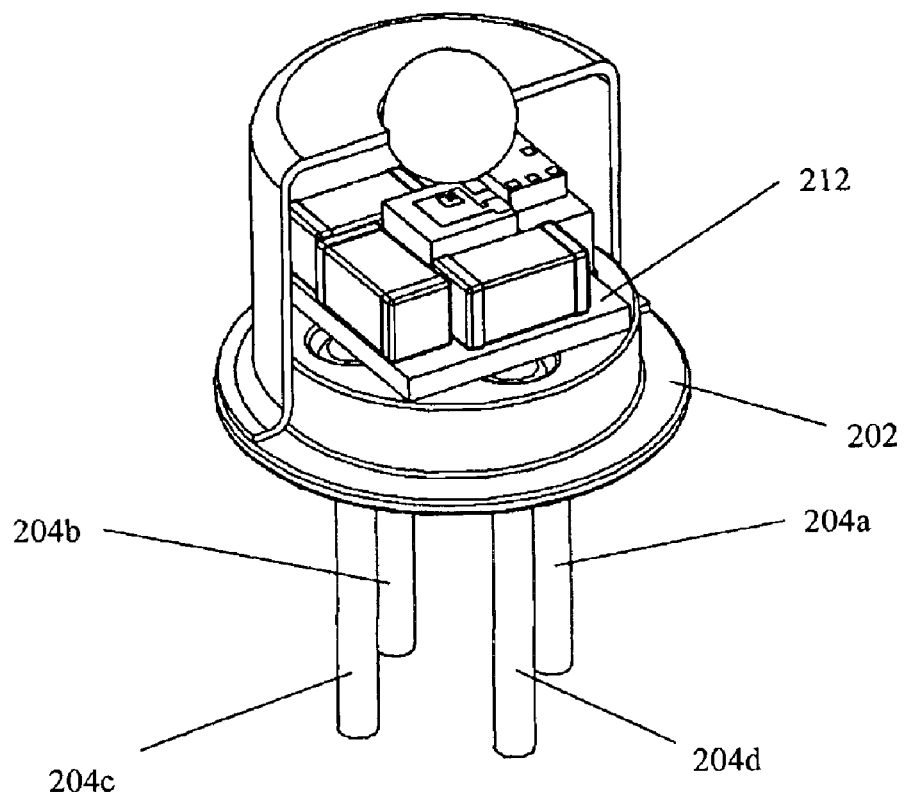
Figure 10B:
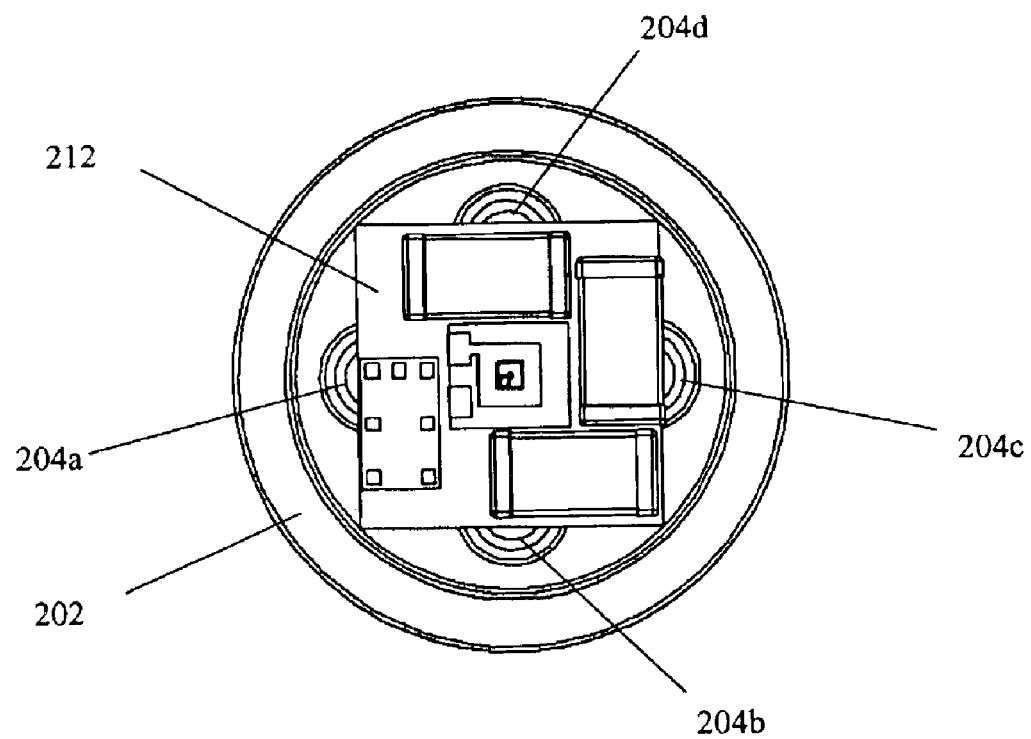
Figure 11A:
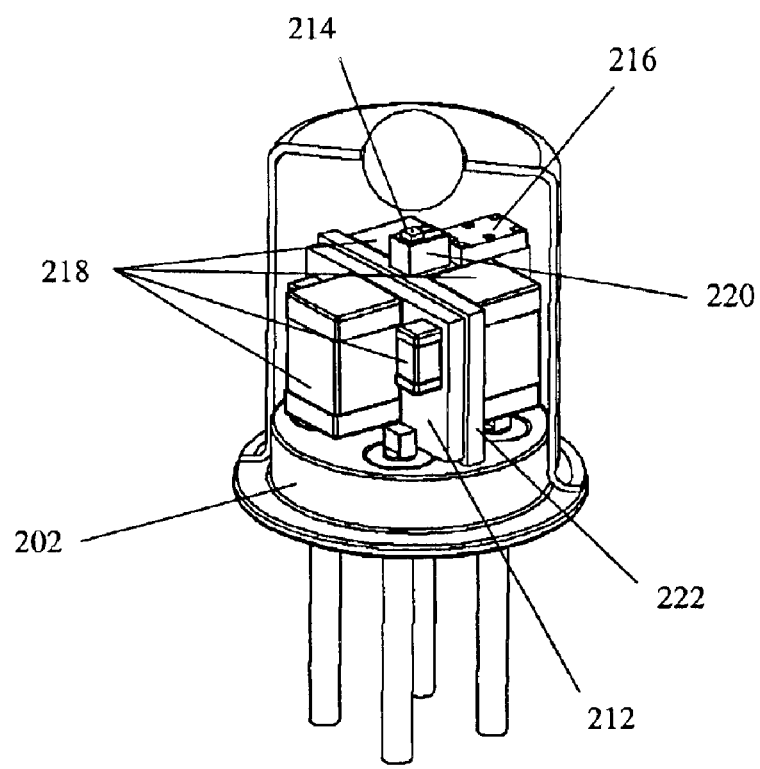
Figure 11B:
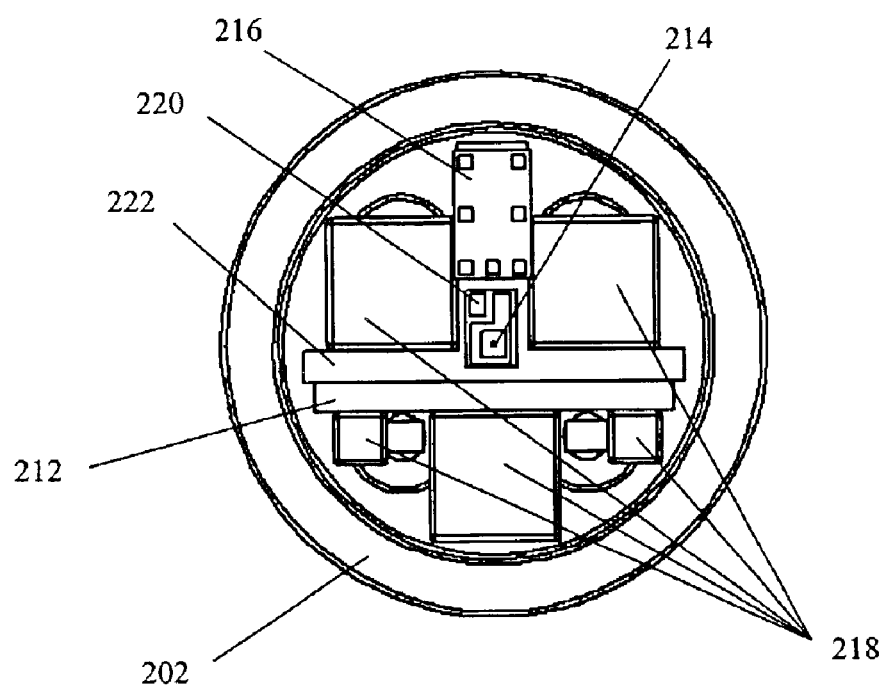
Figure 12A:
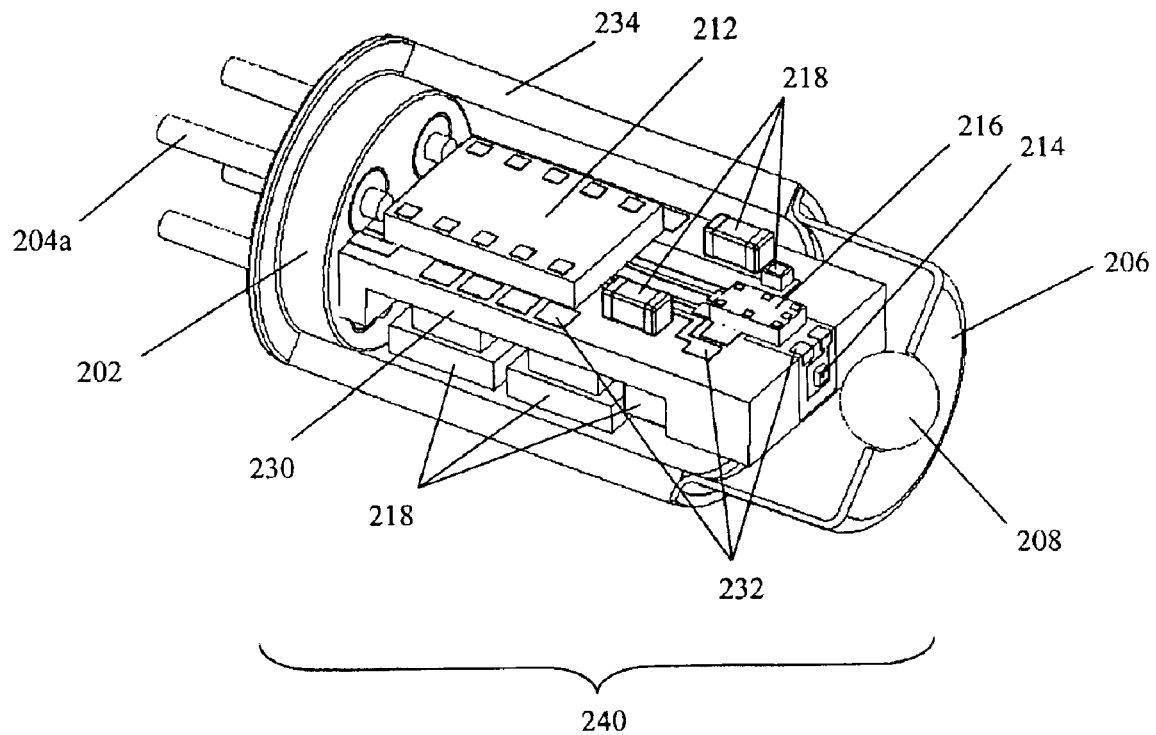
FIGS. 12a and 12b are an isometric diagram of a three-dimensional submount package and a ROSA.

Even with the integration of all the active components into a single ASIC and miniaturization of the passive components, packaging of the APD, TIA and ASIC chips and the passives in the 4-pin TO-46 can is a tight fit. In standard 5-pin APD packages, the APD and TIA are surface mounted on the header between the pins and then wire bonded. Unfortunately, using current ASIC fabrication technologies, the ASIC may be too big to fit between the pins. As technology evolves to reduce the size of the ASIC, standard techniques may be adequate to package the chips and passives inside the TO-46 can. Thus, the integration may be achieved by (a) using standard packaging techniques as shown in FIGS. 9a and 9b, (b) recessing the pins inside the header and surface mounting the ASIC as shown in FIGS. 10a and 10b (c) inserting a spacer in the can and mounting the chips on different surfaces as shown in FIGS. 11a and 11b or (d) mounting the chips and passives on a three-dimensional submount as shown in FIG. 12a. One unique aspect to this type of packaging versus one using discrete chipsets is that all devices are in die form and hermetically sealed in the same package. Other more manufacturable or cheaper techniques for packaging the chips and passives inside the can may be developed.

As shown in FIGS. 9 through 12, a typical APD package 200 includes a header 202 on which the chips and passives are typically mounted and a cap 206. The typical APD TO Can has 5 pins: Vcc, GND, DATA+, DATA−, and Vbias that extend through the header into the interior of the package. However, because this invention places the bias circuitry inside of the can there is no need for a Vbias pin. Therefore, pins 204a through 204d comprise PS-BDSI, GND, DATA+, and DATA−. The cap has a window 208, which in this particular embodiment includes a ball lens 210, for directing light onto the APD chip. The header, and specifically its diameter, is the part that is standardized, e.g. the TO-46 can. The height of the cap may vary for different applications.

As shown in FIGS. 9a and 9b, ASIC chip 212, APD chip 214, TIA chip 216 and the various passives, collectively 218 are packaged using the same approach as known 5-pin APDs. More specifically, ASIC chip 212 is mounted on the interior surface of header 202 between pins 204a–204d. APD chip 214 is positioned on a submount 220, which is mounted on ASIC chip 212. Similarly, the TIA chip 216 and passives 218 are mounted on top of the ASIC. The chips and passives are then wire bonded to the appropriate pins using standard wire bonding technology.

As shown in FIGS. 10a and 10b, ASIC chip 212 is too big to fit between the pins on the surface of header 202. In this embodiment, pins 204a–204d are recessed below the interior surface of header 202, suitably about 100 microns, and ASIC chip 212 is surface mounted on the header, only partially covering the heads of pins 204a–204d. Wire bonding from the recessed pins to the chips is more challenging but doable. The advantage to this approach is that it can accommodate larger ASIC sizes. However, placement of the passives and bond pads is tight and recessing the pins is a slight modification to the standard can.

As shown in FIGS. 11a and 11b, a ceramic spacer 222 is positioned on header 202 between the pins. In this particular embodiment, ASIC chip 212 is mounted vertically on one side of spacer 222 with a couple of passive components 218. APD chip 214 and TIA chip 216 are mounted horizontally on top of spacer 222 with a couple passives 218. Even though the ASIC and APD chips are in different planes, all wire bonds are planar. The APD and TIA chips are bonded with a wire bond process in the horizontal plane. APD submount 220 comes standard with a ninety degree metalization wrap so the APD and ASIC can be wire bonded in the vertical plane. The advantages of this approach are that by using the variable height of the cap and the addition of the spacer to package in three dimensions, it is much easier to accommodate the size of the ASIC, the additional passives and provide adequate bond pads. The disadvantages are the taller cap, preassembly of the chips onto the spacer and wire bonds in two different planes.

FIG. 12a shows an alternative embodiment of the APD, ASIC and related components in a TO style can package similar to figures 11a and 11b. In this design, a submount 230 (suitably made from ceramic based material) with three-dimensional features has plated traces and vias 232, which enable the mounting of passive components 218, header 202, TIA 216, ASIC 212 and APD 214. Electrical connections are made by soldering pins 204a–204d, surface mounting passive components 218 and wire bonding to TIA 216 and APD 214. ASIC 212 electrical connections can be made by either wire bonding to pads 232 or "flip chip" bonding the ASIC to submount 230. After the submount is fully assembled with header 202, a spacer tube 234 is added and assembly is completed with a standard lens cap 206 with lens 210. Spacer tube 234 is important because standard caps have a thin wall, which would not provide adequate support if extended the full distance to header 202. In addition, spacer tube 234 can have features that support the end of submount 230 before cap 206 is added.

Figure 12B:
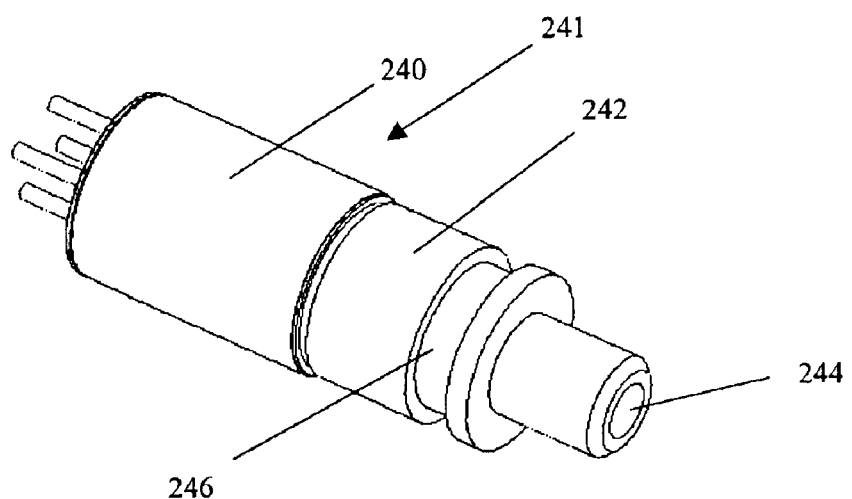

FIG. 12b shows APD can module 240 in FIG. 12a as it would appear when used in a standard ROSA, or Receiver Optical Sub Assembly 241. A nozzle 242 is connected to the end of the APD module with the lens. This nozzle suitably has an opening 244 on one end that is designed to accept a fiber optic ferrule, such as used in SC or LC type connectors. The opposite end of the ferrule is designed to mate with APD module 240. The nozzle also suitably has mechanical features 246, which allow the ROSA to be accurately located in devices such as transceivers and receivers, while providing connector strain relief.

A very significant value of the packaging embodiments described in FIGS. 9–12 is that they enable the packaging of the ASIC and related components internally while maintaining the standard ROSA form factor required by most major transceiver manufacturers. In particular, these package designs enable the invention described in this patent to be used in GBIC (Gigabit Interface Converter), and SFP (Small Form-factor Pluggable) transceivers. The outside diameter is maintained while the length is increased which is generally acceptable.

Figure 13A:
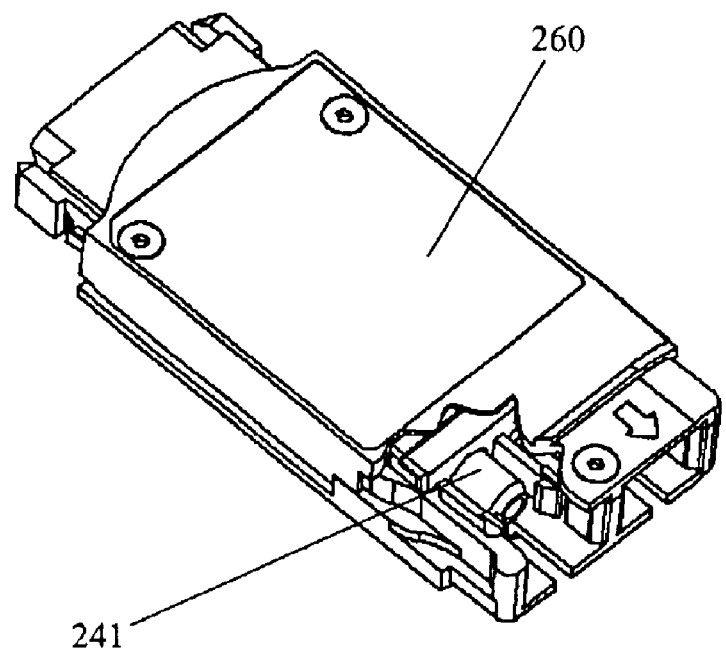
FIGS. 13a and 13b are diagrams of GBIC and SFF/SFP transceiver incorporating the 4-pin APD package.
Figure 13B:
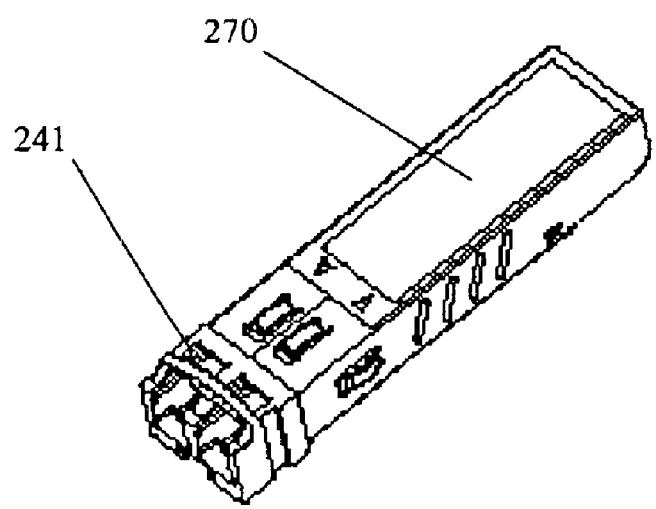

FIGS. 13a and 13b show the ROSA (Receiver Optical Sub Assembly) 241 described in FIG. 12b as it would appear inside industry standard transceivers. FIG. 13a shows a ROSA 241 mounted inside of a GBIC (Gigabit Interface Converter) transceiver 260. FIG. 13b shows a ROSA 241 (partially hidden) similarly mounted inside of a SFF or SFP (Small Form Factor/Small Form Factor Pluggable) transceiver 270. In these applications, the ROSA subassemblies provide a fully packaged optical unit that can be mounted to a PCB much like any standard electrical component. In addition, the mechanical features of the ROSA are used to provide registration for duplex connector spacing as well as mechanical strain relief to ensure that the ROSA solder connections are not damaged or fatigued because of connector insertion/retraction forces. While the two types of transceivers shown here are common examples, the use of ROSAs in transceiver manufacturing is highly standardized among all types of optical transceivers.

While we have been referring to the designs as embodiments of TO-Can packages, one skilled in the art of packaging will realize that alternate, non-TO-can packages may be used to produce the same type of module, as long as the form factor requirements are met. The TO package is preferred however, because it a proven, reliable, standard, and low-cost package. Regardless of the package type, what is most important is that all of the ASIC/APD functionality is provided in a standard ROSA package which has the same form factor as a standard PIN based ROSA package, and serves as viable PIN replacement without requiring significant modifications to a transceiver.

N-pin APD Package

Figure 14:
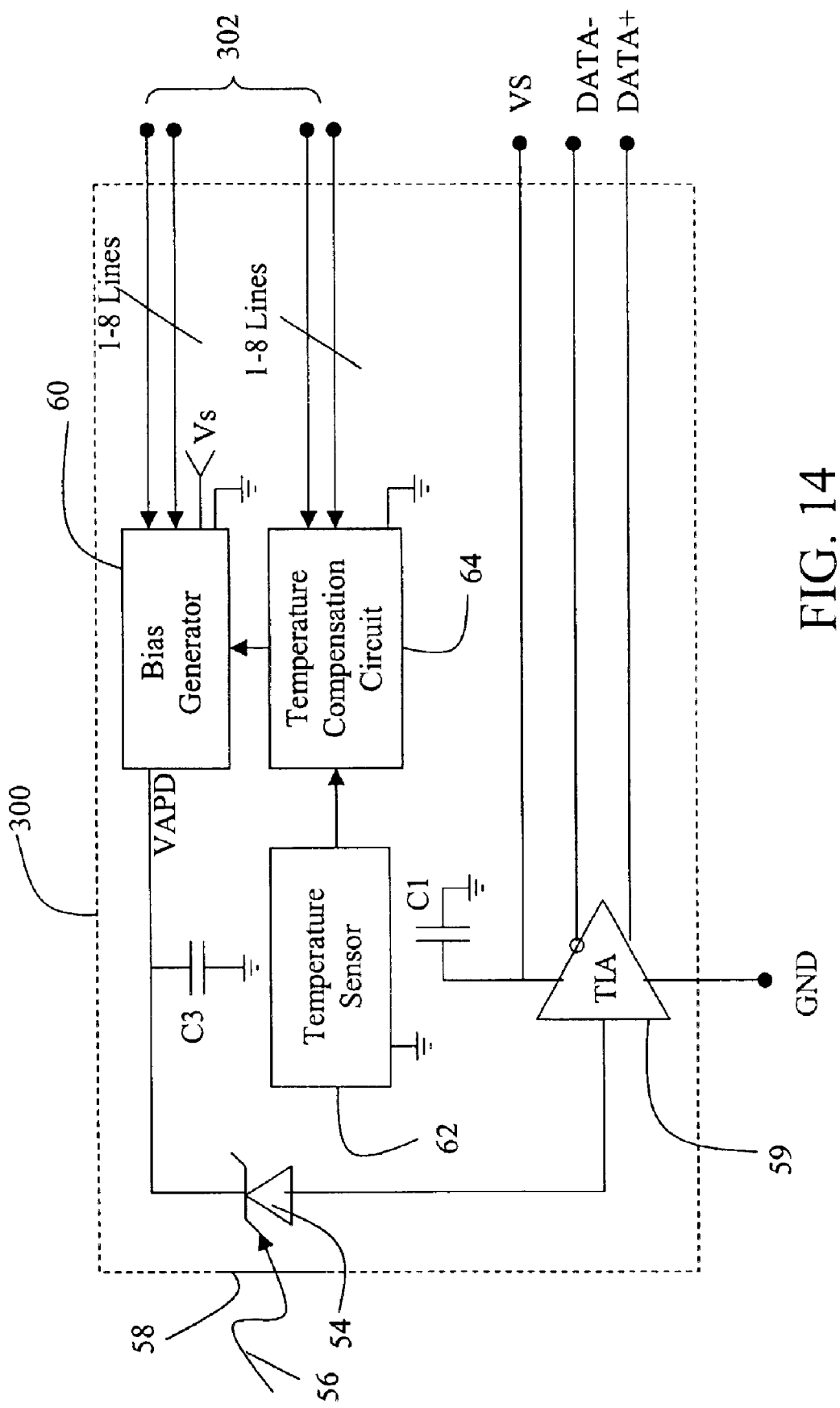
FIG. 14 is an integrated N-pin APD in a butterfly package.

The same principles that facilitated integration of the bias and temperature circuits inside the standard 4-pin package can be applied to other small packages 300, which may or may not be industry standard packages, and which may have greater than 4 pins, e.g. 8 or 16-pin butterfly packages as shown in FIG. 14. In such cases, standard serial or parallel interfaces 302 can be used to communicate with the circuits instead of the 1-wire interface described previously.

Bi-Directional 1-wire Serial Interface

The same principles that provide sustained power to the APD and ASIC 72 while momentarily interrupting the power supply to send data bi-directionally via a 1-wire serial interface can be applied to micro controller/microprocessor peripheral chips such as memory, analog/digital converters, transducers and drive circuits for electromechanical actuators.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:
1. An avalanche photo diode (APD) device comprising:
   A package having at least one data port, a ground port, a power supply port and at least one control port;
   An APD inside the package that generates a photocurrent in response to incident light;
   A transimpedance amplifier (TIA) inside the package that amplifies the photocurrent to produce a data signal that is output at said at least one data port; and
   A bias circuit inside the package that receives power from the power supply port and control data from the at least one control port and generates a bias voltage to reverse bias the APD.
2. The APD device of claim 1, wherein the bias circuit comprises active components that are implemented in a single ASIC and passive components.
3. The APD device of claim 2, wherein the ASIC is fabricated using a high-voltage CMOS process.
4. The APD device of claim 3, wherein the bias circuit is operated at frequencies of at least 1 MHz.
5. The APD device of claim 2, wherein the ASIC further comprises a temperature sensor and a temperature compensation circuit that cause the bias circuit to adjust the bias voltage to compensate for fluctuations in the temperature of the APD.
6. The APD device of claim 2, further comprising a power sense circuit having active components that are implemented in the ASIC and passive components.
7. The APD device of claim 2, further comprising a single power supply and serial interface (PS-BDSI) pin that provides both said power supply port and said control port.
8. The APD device of claim 7, wherein said package is a 4-pin TO-46 can.
9. The APD device of claim 7, wherein the ASIC further comprises a 1-wire serial interface circuit that is configured to communicate via the PS-BDSI pin by interrupting a power signal applied to the PS-BDSI pin to transfer control data.
10. The APD device of claim 9, wherein low, medium and high voltage levels are supplied to the PS-BDSI pin, with said low voltage corresponding to a received zero, said medium voltage corresponding to a received one or a sent zero and said high voltage corresponding to a sent one.
11. The APD device of claim 9, wherein the bias circuit comprises a first storage capacitor and the 1-wire serial interface circuit comprises a first switch network having a normal state in which power supplied to the PS-BDSI pin charges the first storage capacitor to power the device and having data transfer and data return verification states in which the first capacitor is isolated when control data is being received or sent, respectively, at the PS-BDSI pin.
12. The APD device of claim 11, wherein the first switch network comprises a first diode and a first switch that is on during the normal state so that the forward biased first diode charges the first storage capacitor and during the data transfer state so that the reverse biased first diode isolates the first storage capacitor, and the first switch is switched off during the data return verification state to isolate the first storage capacitor.
13. The APD device of claim 11, further comprising an external controller having a second storage capacitor that supplies power for the device and a second switch network having a normal state in which power is supplied from a second storage capacitor to the PS-BDSI pin and having data transfer and data return verification states in which the second storage capacitor is isolated to send and receive control data, respectively, at the PS-BDSI pin.

14. The APD device of claim 13, wherein the second switch network comprises a second diode whose cathode is connected to the PS-BDSI pin, a second switch between the second storage capacitor and the second diode and a third switch connected between the second diode's cathode and ground, said third and second switches being normally off and on, respectively, so that power is supplied from the second storage capacitor through the forward biased second diode to the PS-BDSI pin during the normal state and the reverse biased second diode isolates the second storage capacitor during the data return verification state, and said third and second switches being switched on and off, respectively, to pull the PS-BDSI pin low and isolate the second storage capacitor during the data transfer state.

15. The APD device of claim 13, wherein in the normal state a mid-level voltage is applied to the PS-BDSI pin that corresponds to a one in the external controller and a zero in the 1-wire serial interface circuit, the data transfer state a low-level voltage is applied to the PS-BDSI pin that corresponds to a zero sent by the external controller, and the data return verification state a high-level voltage is applied to the PS-BDSI pin that corresponds to a one sent by the 1-wire serial interface circuit.

16. The APD device of claim 11, wherein said device operates at frequencies of at least 1 MHz and the first and second storage capacitors are at most 10 and 100 microfarads, respectively.

17. The APD device of claim 9, wherein the bias circuit comprises a first storage capacitor and a first diode so that when power is supplied to the PS-BDSI pin the first diode is forward biased and charges the first storage capacitor and when control data is being received diode the first diode is reverse biased and isolates the first storage capacitor.

18. The APD device of claim 17, further comprising an external controller having a second storage capacitor that supplies power for the device and a switch network having a normal state in which power is supplied from the second capacitor to the PS-BDSI pin and having a data transfer state in which the second storage capacitor is isolated to send control data via the PS-BDSI pin.

19. The APD device of claim 9, wherein the 1-wire serial interface circuit comprises an encoder/decoder that embeds a clock signal in transmitted control data and recovers the clock signal from received control data.

20. The APD device of claim 2, wherein said package comprises a header and a plurality of pins that provide said ports, said pins being recessed below the interior surface of the header and said ASIC being surface mounted on said header without covering said pins.

21. The APD device of claim 2, wherein said package comprises a header and a plurality of pins that provide said ports with said pins protruding above the interior surface of the header, further comprising a spacer mounted on the interior surface of the header between the pins, said ASIC, APD and TIA being mounted on at least two different surfaces of said spacer.

22. The APD device of claim 2, wherein said package comprises a header and a plurality of pins that provide said ports with said pins protruding above the interior surface of the header, further comprising a three-dimensional submount mounted on the interior surface of the header between the pins, said ASIC, APD and TIA being mounted on at least front and back surfaces of said submount and a spacer tube around said submount.

23. The APD device of claim 2, wherein said at least 1 control port is a multi-line serial interface.

24. The APD device of claim 2, wherein said APD, TIA and bias circuit are chips in die form that are hermetically sealed inside the package.

25. The APD device of claim 2, further comprising a nozzle connected to one end of the package, said nozzle having an opening that is designed to accept a fiber optic ferrule.

26. The APD device of claim 25, wherein the receiver optical sub-assembly (ROSA) formed by the package and nozzle are mounted inside a transceiver.

27. The APD device of claim 26, wherein the transceiver is one of a GBIC, SFP or SFF.

28. An avalanche photo diode (APD) device comprising:
A 4-pin package having a pair of data pins, a ground pin, and a power supply and bi-directional serial interface (PS-BDSI) pin;
An APD inside the package that generates a photocurrent in response to incident light;
A transimpedance amplifier (TIA) inside the package that amplifies the photocurrent to produce a data signal that is output on said data pins; and
An ASIC inside the package that includes a bias circuit that receives a power signal from the PS-BDSI pin to generate a bias voltage to reverse bias the APD and a 1-wire serial interface circuit that is configured to communicate by interrupting the power signal applied to the PS-BDSI pin to bi-directionally send and receive control data.

29. The APD device of claim 28, wherein the ASIC is fabricated using a high-voltage CMOS process.

30. The APD device of claim 28, wherein the bias circuit is operated at frequencies of at least 1 MHz.

31. The APD device of claim 28, wherein the ASIC further comprises a temperature sensor and a temperature compensation circuit that cause the bias circuit to adjust the bias voltage to compensate for fluctuations in the temperature of the APD.

32. The APD device of claim 28, wherein said package is a 4-pin TO-46 can.

33. The APD device of claim 28, wherein said APD, TIA and bias circuit are chips in die form that are hermetically sealed inside the package.

34. The APD device of claim 28, further comprising a nozzle connected to one end of the package, said nozzle having an opening that is designed to accept a fiber optic ferrule.

35. The APD device of claim 34, wherein the receiver optical sub-assembly (ROSA) formed by the package and nozzle are mounted inside a transceiver.

36. The APD device of claim 35, wherein the transceiver is one of a GBIC, SFP or SFF.

37. The APD device of claim 28, wherein low, medium and high voltage levels are supplied to the PS-BDSI pin, with said low voltage corresponding to a received zero, said medium voltage corresponding to a received one or a sent zero and said high voltage corresponding to a sent one.

38. The APD device of claim 28, wherein the bias circuit comprises a first storage capacitor and the 1-wire serial interface circuit comprises a switch network having a normal state in which power supplied to the PS-BDSI pin charges the first capacitor to power the device and having data transfer and data return verification states in which the first storage capacitor is isolated when control data is being received or sent, respectively, at the PS-BDSI pin.

39. The APD device of claim 28, wherein the 1-wire serial interface circuit comprises an encoder/decoder that embeds a clock signal in transmitted control data and recovers the clock signal from received control data.

40. An avalanche photo diode (APD) circuit comprising:
A 4-pin APD package having a pair of data pins, a ground pin, and a power supply and bi-directional serial interface (PS-BDSI) pin, said package comprising:
An APD that generates a photocurrent in response to incident light;
A transimpedance amplifier (TIA) that amplifies the photocurrent to produce a data signal that is output on said data pins;
An ASIC that embodies a bias circuit that generates a bias voltage to reverse bias the APD and a 1-wire serial interface circuit that is configured to communicate via the PS-BDSI pin; and
An external controller circuit that supplies a voltage to the PD-BDSI pin to power the ASIC, APD and TIA while interrupting the voltage to bi-directionally send and receive control data.

41. The APD circuit of claim 40, wherein the bias circuit comprises a first storage capacitor and the 1-wire serial interface circuit comprises a first switch network having a normal state in which power supplied to the PS-BDSI pin charges the first storage capacitor to power the device and having data transfer and data return verification states in which the first storage capacitor is isolated when control data is being received or sent, respectively, at the PS-BDSI pin.

42. The APD device of claim 41, wherein the external controller comprises a second storage capacitor that supplies power and a second switch network having a normal state in which power is supplied from the second storage capacitor to the PS-BDSI pin and having data transfer and data return verification states in which the second storage capacitor is isolated to send and receive control data, respectively, at the PS-BDSI pin.

43. The APD device of claim 42, wherein the normal state a mid-level voltage is applied to the PS-BDSI pin that corresponds to a one in the external controller and a zero in the 1-wire serial interface circuit, the data transfer state a low-level voltage is applied to the PS-BDSI pin that corresponds to a zero sent by the external controller, and the data return verification state a high-level voltage is applied to the PS-BDSI pin that corresponds to a one sent by the 1-wire serial interface circuit.

* * * * *